(12) United States Patent
McCord et al.

(10) Patent No.: US 11,686,818 B2
(45) Date of Patent: Jun. 27, 2023

(54) MOUNTING CONFIGURATIONS FOR OPTOELECTRONIC COMPONENTS IN LIDAR SYSTEMS

(71) Applicant: Cepton Technologies, Inc., San Jose, CA (US)

(72) Inventors: Mark Armstrong McCord, Los Gatos, CA (US); Roger David Cullumber, Hollister, CA (US); Jun Pei, Saratoga, CA (US); Henrik K. Nielsen, San Jose, CA (US)

(73) Assignee: Cepton Technologies, Inc., San Jose, CA (US)

( * ) Notice: Subject to any disclaimer, the term of this patent is extended or adjusted under 35 U.S.C. 154(b) by 388 days.

(21) Appl. No.: 16/828,366

(22) Filed: Mar. 24, 2020

(65) Prior Publication Data

US 2020/0309910 A1    Oct. 1, 2020

Related U.S. Application Data

(60) Provisional application No. 62/823,406, filed on Mar. 25, 2019.

(51) Int. Cl.
*G01S 7/481* (2006.01)
*G02B 6/32* (2006.01)
(Continued)

(52) U.S. Cl.
CPC ............ *G01S 7/481* (2013.01); *G01S 7/4815* (2013.01); *G01S 7/4816* (2013.01); *G01S 17/42* (2013.01);
(Continued)

(58) Field of Classification Search
CPC ...... G01S 7/481; G01S 7/4815; G01S 7/4816; G01S 17/42; G02B 6/32; G02B 6/4206; G02B 2006/12102
See application file for complete search history.

(56) References Cited

U.S. PATENT DOCUMENTS

2015/0034809 A1   2/2015  Droz et al.
2017/0168144 A1   6/2017  Gimpel et al.
(Continued)

FOREIGN PATENT DOCUMENTS

WO     2018/054512 A1    3/2018

OTHER PUBLICATIONS

International Search Report dated Jun. 24, 2020 in related corresponding International Application No. PCT/US2020/024483, filed Mar. 24, 2020 (eleven pages).
(Continued)

*Primary Examiner* — Jamil Ahmed
(74) *Attorney, Agent, or Firm* — Kilpatrick Townsend & Stockton LLP

(57) ABSTRACT

A LiDAR system includes a first optical lens, and one or more first optoelectronic packages spaced apart from the first optical lens along the optical axis of the first optical lens. Each respective first optoelectronic package includes a first plurality of optoelectronic components positioned on the respective first optoelectronic package such that a surface of each respective optoelectronic component lies substantially on the first surface of best focus. The LiDAR system further includes a second optical lens, and one or more second optoelectronic packages spaced apart from the second optical lens along the optical axis of the second optical lens. Each respective second optoelectronic package includes a second plurality of optoelectronic components positioned on the respective second optoelectronic package such that a surface of each respective optoelectronic component lies substantially on the second surface of best focus.

25 Claims, 27 Drawing Sheets

(51) Int. Cl.
  *G02B 6/42* (2006.01)
  *G01S 17/42* (2006.01)
  *G02B 6/12* (2006.01)
(52) U.S. Cl.
  CPC ............ *G02B 6/32* (2013.01); *G02B 6/4206* (2013.01); *G02B 2006/12102* (2013.01)

(56) References Cited

U.S. PATENT DOCUMENTS

2018/0180720 A1* 6/2018 Pei ..................... G01S 7/4813
2019/0391350 A1* 12/2019 Evans ................. G02B 6/4292

OTHER PUBLICATIONS

Supplementary European Search Report dated Dec. 9, 2022 in related European Patent Application No. 20777906.7 (eleven pages).

* cited by examiner

000
MOUNTING CONFIGURATIONS FOR OPTOELECTRONIC COMPONENTS IN LIDAR SYSTEMS

CROSS-REFERENCES TO RELATED APPLICATIONS

The present application is a non-provisional application of and claims the benefit and priority under 35 U.S.C. 119(e) of U.S. Provisional Application No. 62/823,406, filed Mar. 25, 2019, entitled "MOUNTING CONFIGURATIONS FOR OPTOELECTRONIC COMPONENTS IN LIDAR SYSTEMS," the entire content of which is incorporated herein by reference for all purposes.

BACKGROUND

Three-dimensional sensors can be applied in autonomous vehicles, drones, robotics, security applications, and the like. Scanning LiDAR sensors may achieve high angular resolutions appropriate for such applications at an affordable cost. LiDAR sensors may include optoelectronic components, such as light sources for emitting laser beams, and detectors for detecting reflected laser beams. There is a need for improved mounting configurations for optoelectronic components in LiDAR sensors.

SUMMARY OF THE INVENTION

According to some embodiments, a LiDAR system includes a first optical lens characterized by a first optical axis, a first lens center, and a first surface of best focus, and one or more first optoelectronic packages spaced apart from the first optical lens along the first optical axis. Each respective first optoelectronic package includes a first plurality of optoelectronic components positioned on the respective first optoelectronic package such that a surface of each respective optoelectronic component of the first plurality of optoelectronic components lies substantially on the first surface of best focus. The LiDAR system further includes a second optical lens characterized by a second optical axis, a second lens center, and a second surface of best focus, and one or more second optoelectronic packages spaced apart from the second optical lens along the second optical axis. Each respective second optoelectronic package includes a second plurality of optoelectronic components positioned on the respective second optoelectronic package such that a surface of each respective optoelectronic component of the second plurality of optoelectronic components lies substantially on the second surface of best focus.

According to some embodiments, an optoelectronic package for a LiDAR system is provided. The LiDAR system includes an optical lens characterized by an optical axis, a lens center, and a surface of best focus. The optoelectronic package includes a substrate spaced apart from the optical lens along the optical axis, and a plurality of optoelectronic components positioned on the substrate such that a surface of each respective optoelectronic component lies substantially on the surface of best focus of the optical lens.

According to some embodiments, an optoelectronic package for a LiDAR system is provided. The LiDAR system includes an optical lens characterized by an optical axis, a lens center, and a surface of best focus. The optoelectronic package includes a substrate spaced apart from the optical lens along the optical axis, and a plurality of optoelectronic components positioned on the substrate such that each respective optoelectronic component is oriented substantially toward the lens center.

DETAILED DESCRIPTION OF THE SPECIFIC EMBODIMENTS

A LiDAR system may include an array of light sources (e.g., light sources) for emitting light beams, which may be projected onto a target scene through an emission lens. Some form of scanning mechanism may be used to scan the light beams across the target scene. The LiDAR system may include a receiving lens for collecting return light beams reflected from the target scene and focus them onto an array of detectors. In some embodiments, the light sources may be mounted at different distances from the emission lens in order to minimize field curvature from the emission lens. Alternatively or additionally, each light source may be oriented so that it points substantially at the center of the emission lens for more optimally projecting the light beams. Similarly, the detectors may also be mounted at various distances from the receiving lens and oriented so that a normal of the detection surface of each detector points substantially toward the center of the receiving lens. In high-volume productions, there is a need for low cost and precise automated placement of the light sources and the detectors.

In some embodiments, an array of two or more light sources and/or detectors are placed into a surface-mount device (SMD) package. The SMD package may be designed to be directly soldered onto a printed circuit board (PCB). The light sources and/or detectors may be positioned in the SMD package at different heights to mitigate the effect of field curvature of an emission lens or a receiving lens. Alternatively or additionally, the light sources and/or detectors may be oriented so that they point substantially toward the center of the emission lens or the receiving lens.

Figure 1:
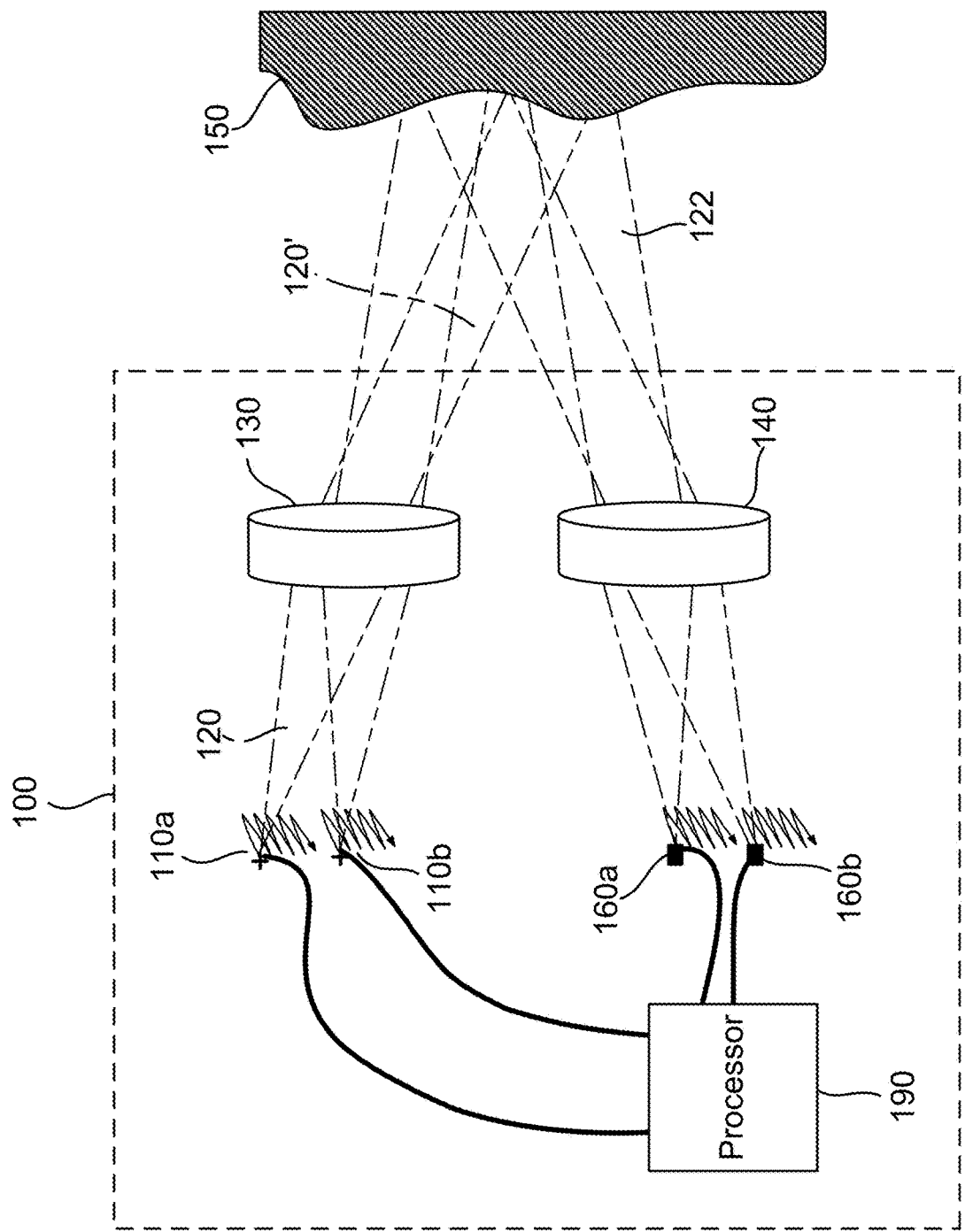
FIG. 1 illustrates schematically a LiDAR sensor for three-dimensional imaging according to some embodiments.

FIG. 1 illustrates schematically a LiDAR sensor 100 for three-dimensional imaging according to some embodiments. The LiDAR sensor 100 includes an emission lens 130 and a receiving lens 140. The LiDAR sensor 100 includes a light source 110a disposed substantially in a back focal plane of the emission lens 130. The light source 110a is operative to emit a laser pulse 120 from a respective emission location in the back focal plane of the emission lens 130. The emission lens 130 is configured to collimate and direct the laser pulse 120 toward an object 150 located in front of the LiDAR sensor 100. For a given emission location of the light source 110a, the collimated laser pulse 120' is directed at a corresponding angle toward the object 150.

A portion of the collimated laser pulse 120' may be reflected off of the object 150 toward the receiving lens 140. The receiving lens 140 is configured to focus the portion 122 of the laser pulse reflected off of the object 150 onto a corresponding detection location in the focal plane of the receiving lens 140. The LiDAR sensor 100 further includes a detector 160a disposed substantially at the focal plane of the receiving lens 140. The detector 160a is configured to receive and detect the portion 122 of the laser pulse 120 reflected off of the object 150 at the corresponding detection location. The corresponding detection location of the detector 160a is optically conjugate with the respective emission location of the light source 110a.

The laser pulse 120 may be of a short duration, for example, 10 ns pulse width. The LiDAR sensor 100 further includes a processor 190 coupled to the light source 110a and the detector 160a. The processor 190 is configured to determine a time of flight (TOF) of the laser pulse 120 from emission to detection. Since the laser pulse 120 travels at the speed of light, a distance between the LiDAR sensor 100 and the object 150 may be determined based on the determined time of flight.

One way of scanning the laser beam 120' across a FOV is to move the light source 110a laterally relative to the emission lens 130 in the back focal plane of the emission lens 130. For example, the light source 110a may be raster scanned to a plurality of emission locations in the back focal plane of the emission lens 130 as illustrated in FIG. 1. The light source 110a may emit a plurality of laser pulses at the plurality of emission locations. Each laser pulse emitted at a respective emission location is collimated by the emission lens 130 and directed at a respective angle toward the object 150, and impinges at a corresponding point on the surface of the object 150. Thus, as the light source 110a is raster scanned within a certain area in the back focal plane of the emission lens 130, a corresponding object area on the object 150 is scanned. The detector 160a may be raster scanned to be positioned at a plurality of corresponding detection locations in the focal plane of the receiving lens 140, as illustrated in FIG. 1. The scanning of the detector 160a may be performed synchronously with the scanning of the light source 110a, so that the detector 160a and the light source 110a are always optically conjugate with each other at any given time. Other scanning patterns, such as Lissajous patterns and the like, are also possible.

By determining the time of flight for each laser pulse emitted at a respective emission location, the distance from the LiDAR sensor 100 to each corresponding point on the surface of the object 150 may be determined. In some embodiments, the processor 190 is coupled with a position encoder that detects the position of the light source 110a at each emission location. Based on the emission location, the angle of the collimated laser pulse 120' may be determined. The X-Y coordinate of the corresponding point on the surface of the object 150 may be determined based on the angle and the distance to the LiDAR sensor 100. Thus, a three-dimensional image of the object 150 may be constructed based on the measured distances from the LiDAR sensor 100 to various points on the surface of the object 150. In some embodiments, the three-dimensional image may be represented as a point cloud, i.e., a set of X, Y, and Z coordinates of the points on the surface of the object 150.

In some embodiments, the intensity of the return laser pulse 122 is measured and used to adjust the power of subsequent laser pulses from the same emission point, in order to prevent saturation of the detector, improve eye-safety, or reduce overall power consumption. The power of the laser pulse may be varied by varying the duration of the laser pulse, the voltage or current applied to the laser, or the charge stored in a capacitor used to power the laser. In the latter case, the charge stored in the capacitor may be varied by varying the charging time, charging voltage, or charging current to the capacitor. In some embodiments, the intensity may also be used to add another dimension to the image. For example, the image may contain X, Y, and Z coordinates, as well as reflectivity (or brightness).

The angular field of view (AFOV) of the LiDAR sensor 100 may be estimated based on the scanning range of the light source 110a and the focal length of the emission lens 130 as, $$AFOV = 2 \tan^{-1}\left(\frac{h}{2f}\right),$$

where h is scan range of the light source 110a along certain direction, and f is the focal length of the emission lens 130. For a given scan range h, shorter focal lengths would produce wider AFOVs. For a given focal length f, larger scan ranges would produce wider AFOVs. In some embodiments, the LiDAR sensor 100 may include multiple light sources disposed as an array at the back focal plane of the emission lens 130, so that a larger total AFOV may be achieved while keeping the scan range of each individual light source relatively small. Accordingly, the LiDAR sensor 100 may include multiple detectors disposed as an array at the focal plane of the receiving lens 140, each detector being conjugate with a respective light source. For example, the LiDAR sensor 100 may include a second light source 110b and a second detector 160b, as illustrated in FIG. 1. In other embodiments, the LiDAR sensor 100 may include four light sources and four detectors, or eight light sources and eight detectors. In one embodiment, the LiDAR sensor 100 may include 8 light sources arranged as a 4×2 array and 8 detectors arranged as a 4×2 array, so that the LiDAR sensor 100 may have a wider AFOV in the horizontal direction than its AFOV in the vertical direction. According to various embodiments, the total AFOV of the LiDAR sensor 100 may range from about 5 degrees to about 15 degrees, or from about 15 degrees to about 45 degrees, or from about 45 degrees to about 120 degrees, depending on the focal length of the emission lens, the scan range of each light source, and the number of light sources.

The light source 110a may be configured to emit laser pulses in the ultraviolet, visible, or near infrared wavelength ranges. The energy of each laser pulse may be in the order of microjoules, which is normally considered to be eye-safe for repetition rates in the KHz range. For light sources operating in wavelengths greater than about 1500 nm, the energy levels could be higher as the eye does not focus at those wavelengths. The detector 160a may comprise a silicon avalanche photodiode, a photomultiplier, a PIN diode, or other semiconductor sensors.

The angular resolution of the LiDAR sensor 100 can be effectively diffraction limited, which may be estimated as, $$\theta = 1.22 \lambda/D,$$

where λ is the wavelength of the laser pulse, and D is the diameter of the lens aperture. The angular resolution may also depend on the size of the emission area of the light source 110a and aberrations of the lenses 130 and 140. According to various embodiments, the angular resolution of the LiDAR sensor 100 may range from about 1 mrad to about 20 mrad (about 0.05-1.0 degrees), depending on the type of lenses.

Figure 2:
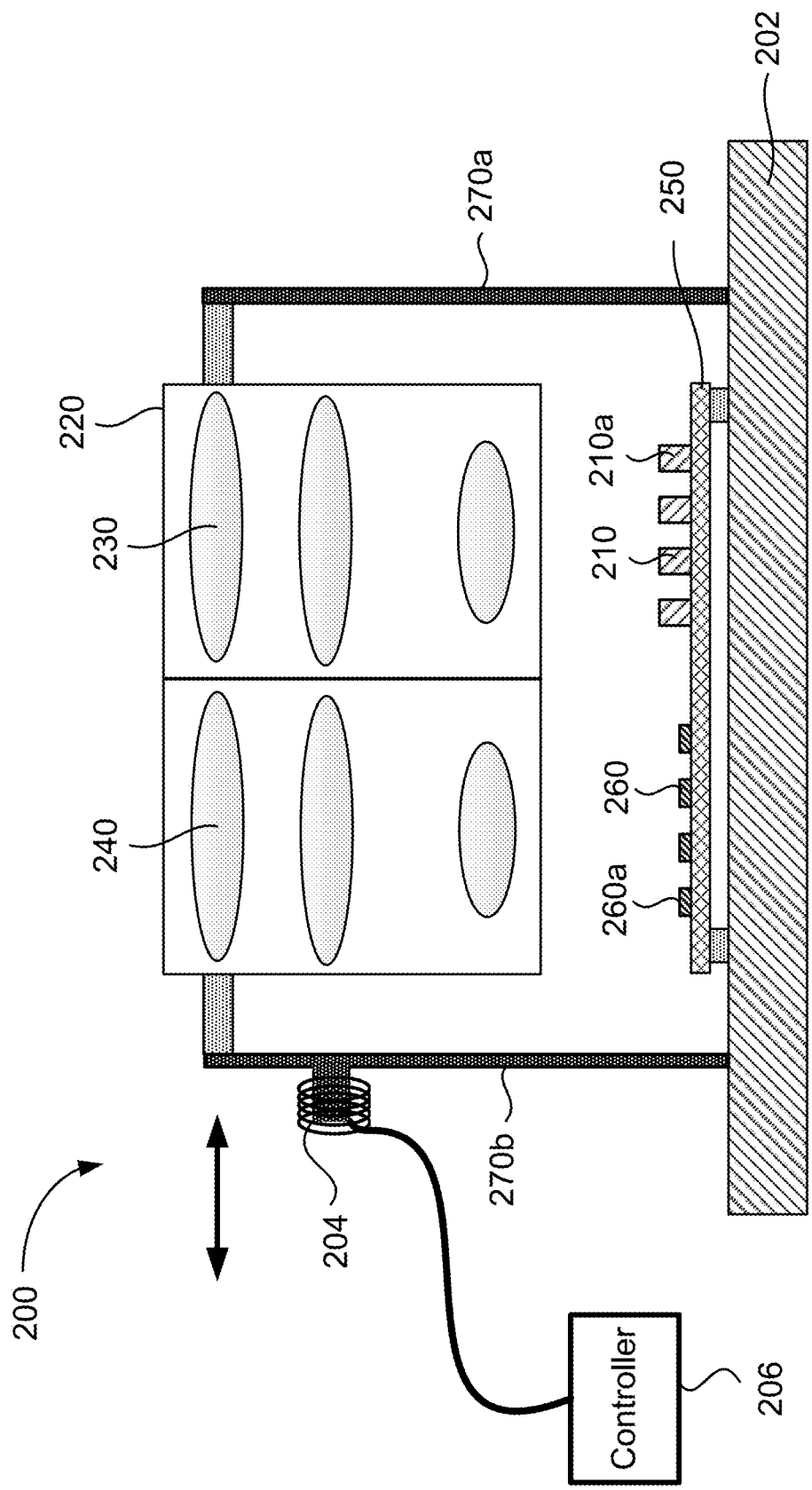
FIG. 2 illustrates schematically an exemplary LiDAR system according to some embodiments.

FIG. 2 illustrates schematically an exemplary LiDAR system 200. The LiDAR system 200 may include two lenses—an emission lens 230 and a receiving lens 240. Each of the emission lens 230 and the receiving lens 240 may be a compound lens that includes multiple lens elements. The emission lens 230 and the receiving lens 240 may be mounted in a lens mount 220. The lens mount 220 with the emission lens 230 and the receiving lens 240 attached thereto may be referred to herein as a lens assembly.

The LiDAR system 200 may also include one or more light sources 210 (e.g., light sources), and one or more detectors 260 (e.g., four light sources 210 and four detectors 260 as shown in FIG. 2). The light sources 210 may be mounted on an optoelectronic board 250 and are positioned behind the emission lens 230 (e.g., in the focal plane of the emission lens 230). The detectors 260 may be mounted on an optoelectronic board 250 and positioned behind the receiving lens 240 (e.g., in the focal plane of the receiving lens 240). The optoelectronic board 250 with the light sources 210 and the detectors 260 mounted thereon may be referred to herein as an optoelectronic assembly.

As discussed above with reference to FIG. 1, each respective light source 210a and a corresponding detector 260a are positioned on the optoelectronic board 250 such that the position of each respective light source 210a is optically conjugate with the position of the corresponding detector 260a. Therefore, a light beam emitted by a respective light source 210a may be projected or collimated by the emission lens 230, and reflected off of an object in front of the LiDAR system 200; and the reflected light beam may be focused by the receiving lens 240 onto the corresponding detector 260a.

In some embodiments, the lens assembly may be flexibly attached to the base 202 via a pair of flexures 270a and 270b as illustrated in FIG. 2. One end of each of the pair of flexures 270a and 270b is attached to the base 202, while the other end is attached to the lens assembly 220. The pair of flexures 270a and 270b may be coupled to an actuator 204 (also referred herein as a driving mechanism), such as a voice coil motor. The actuator 204 may be controlled by a controller 206 to cause the pair of flexures 270a and 270b to be deflected left or right as in a parallelogram, thus causing the lens assembly 220 to move left or right as indicated by the double-sided arrow in FIG. 2. The lateral movement of the emission lens 230 may cause the laser beams emitted by the light sources 210 to be scanned across a FOV in front of the LiDAR system 200. As the entire lens assembly 220, including the emission lens 230 and the receiving lens 240, is moved as a single unit, the optical conjugate relationship between the light sources 210 and the detectors 260 are maintained as the lens assembly 220 is scanned.

Although FIG. 2 shows two rod-shaped flexures 270a and 270b for moving the lens assembly 220, other flexure mechanisms or stages may be used. For example, springs, air bearings, and the like, may be used. In some embodiments, the drive mechanism 204 may include a voice coil motor (VCM), a piezo-electric actuator, and the like. At high scan frequencies, the pair of flexures 270a and 270b and drive mechanism 204 may be operated at or near its resonance frequency in order to minimize power requirements.

The scanning may be achieved by other ways. For example, the lens assembly may be fixed, while the optoelectronic board 250 may be scanned relative to the lens assembly (e.g., via a set of flexures). In some embodiments, scanning may be implemented using a rotating platform encompassing the emission lens 230, the receiving lens 240, the light sources 210, and the detectors 260. Alternatively, a rotating polygonal mirror, or one or more oscillating mirrors, may be used.

The LiDAR system 200 may include a plurality of light sources 210 and a plurality of detectors 260. The plurality of light sources 210 may be arranged as either a one-dimensional or a two-dimensional array (e.g., in the case of a two-dimensional array, there may be one or more rows offset from each other in the direction perpendicular to the paper). Similarly, the plurality of detectors 260 may also be arranged as either a one-dimensional or a two-dimensional array.

Figure 3:
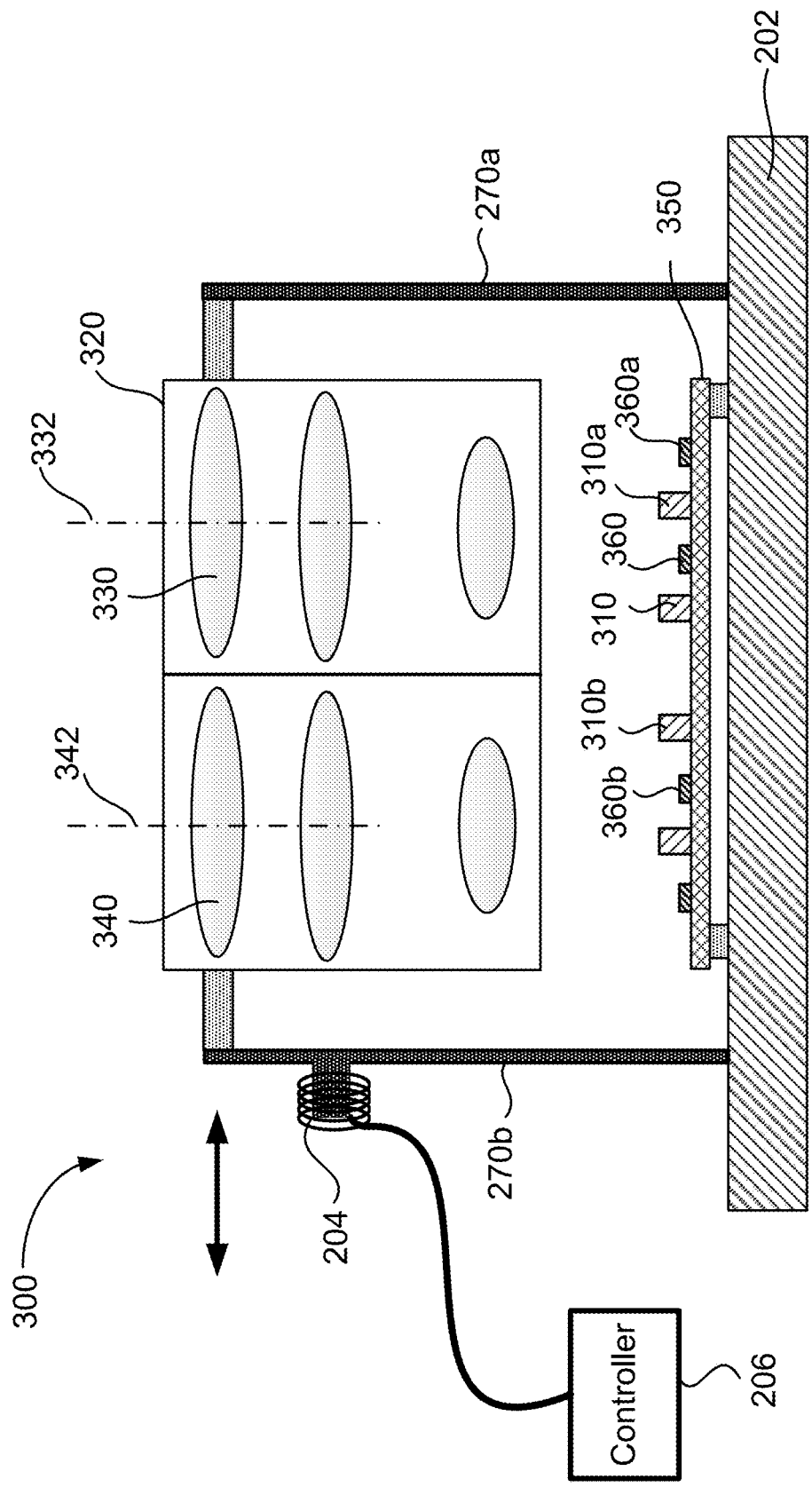
FIG. 3 illustrates schematically a scanning LiDAR system according to some embodiments.

FIG. 3 illustrates schematically a scanning LiDAR system 300 according to some embodiments. Similar to the LiDAR system 200 illustrated in FIG. 2, the LiDAR system 300 also include two lenses—a first lens 330 and a second lens 340. The first lens 330 and the second lens 340 may be mounted in a lens mount 320. The first lens 330 has a first optical axis 332, and the second lens 340 has a second optical axis 342 substantially parallel to the first optical axis 332. The LiDAR system 300 further includes a plurality of light sources 310 and a plurality of detectors 360. The light sources 310 and the detectors 360 may be mounted on an optoelectronic board 350.

Here, instead of having all the light sources 310 behind one lens and all the detectors 360 behind the other lens as in the LiDAR system 200 illustrated in FIG. 2, a first set of light sources 310a and a first set of detectors 360a are positioned in the focal plane of the first lens 330, and a second set of light sources 310b and a second set of detectors 360b are positioned in the focal plane of the second lens 340. The first set of light sources 310a and the first set of detectors 360a behind the first lens 330 may be referred to as a first transceiver array. Similarly, the second set of light sources 310b and the second set of detectors 360b behind the second lens 340 may be referred to as a second transceiver array. Thus, each of the first lens 330 and the second lens 340 functions as both emission lens and receiving lens. Therefore, the first lens 330 and the second lens 340 may be referred to as transceiver lenses.

Each respective detector 360b of the second set of detectors 360b is located at a respective detector position on the focal plane of the second lens 340 that is optically conjugate with a respective position of a corresponding light source 310a of the first set of light sources 310a on the focal plane of the first lens 330, so that the respective detector 360b of the second set of detectors 360b detects a light beam that is emitted by the corresponding light source 310a of the first set of light sources 310a and is reflected off of one or more objects (not shown in FIG. 3) in front of the first lens 330 and the second lens 340.

Similarly, each respective detector 360a of the first set of detectors 360a is located at a respective detector position on the focal plane of the first lens 330 that is optically conjugate with a respective position of a corresponding light source 310b of the second set of light sources 310b on the focal plane of the second lens 340, so that the respective detector 360a of the first set of detectors 360a detects a light beam that is emitted by the corresponding light source 310b of the second set of light sources 310b and is reflected off of the one or more objects.

According to some embodiments, a plurality of light sources and/or a plurality of detectors may be mounted on a platform in a configuration that accounts for the field curvature of a lens. Field curvature, also known as "curvature of field" or "Petzval field curvature," describes the optical aberration in which a flat object normal to the optical axis cannot be brought properly into focus on a flat image plane. Consider a single-element lens system for which all planar wave fronts are focused to a point at a distance f from the lens, f being the focal length of the lens. Placing this lens the distance f from a flat image sensor, image points near the optical axis may be in perfect focus, but rays off axis may come into focus before the image sensor. This may be less of a problem when the imaging surface is spherical. Although modern lens designs, for example lens designs that utilize multiple lens elements, may be able to minimize field curvature (or to "flatten the field") to a certain degree, some residue field curvature may still exist.

In the presence of field curvature of a lens, if a plurality of light sources 210 are mounted on a planar surface, such as illustrated in FIG. 2, laser pulses emitted by light sources 210 that are positioned off from the optical axis may not be perfectly collimated by the emission lens 230 due to field curvature of the emission lens 230. Similarly, if a plurality of detectors 260 are mounted on a planar surface as illustrated in FIG. 2, the laser pulses reflected off of objects may not be brought into perfect focus by the receiving lens 240 at the detectors that are positioned off from the optical axis due to field curvature of the receiving lens 240.

Figure 4:
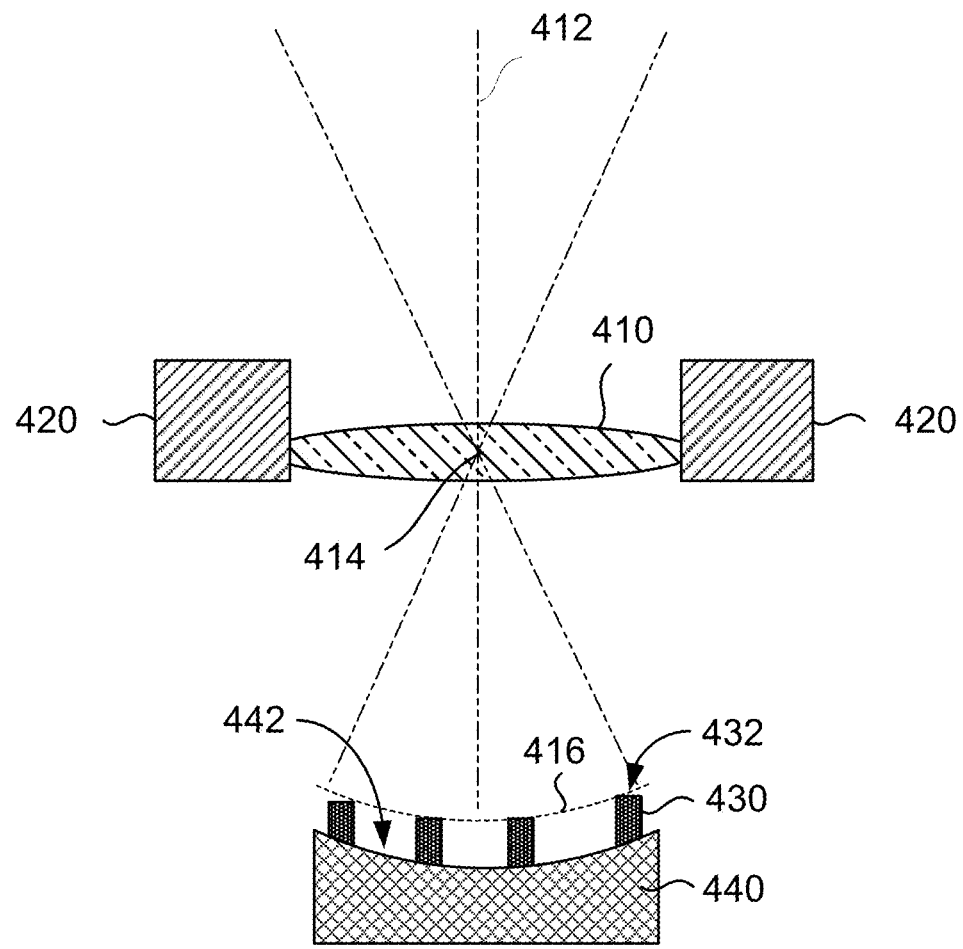
FIG. 4 illustrates a schematic cross-sectional view of a mounting configuration for optoelectronic components in a scanning LiDAR system that may take into account lens field curvatures according to some embodiments.

FIG. 4 illustrates a schematic cross-sectional view of a mounting configuration for optoelectronic components in a scanning LiDAR system that may take into account lens field curvatures according to some embodiments. An optical lens 410 may be mounted on a lens holder 420. The lens 410 may be characterized by an optical axis 412 that passes through the lens center 414, and a surface of best focus 416 at a distance f from the lens 410, f being the focal length of the lens 410. The surface of best focus 416 may be curved due to field curvature as discussed above, and may be referred to as a curved "focal plane" of the lens 410. A plurality of light sources 430 may be mounted on a surface 442 of a platform 440 positioned approximately at the distance f from the lens 410 along the optical axis 412. In some embodiments, the surface 442 of the platform 440 may have a curved shape that substantially matches the surface of best focus 416 of the lens 410, so that an emission surface 432 of each of the plurality of light sources 430 may lie approximately at the surface of best focus 416 of the lens 410. By mounting the plurality of light sources 430 in this configuration, laser pulses emitted by each light source 430 may be nearly perfectly collimated by the lens 410 even if the light source 430 is positioned off from the optical axis 412.

For example, assuming that the surface of best focus 416 of the lens 410 has a spherical shape, the surface 442 of the platform 440 may be configured to have a spherical shape so that an emitting surface 432 of each light source 430 may lie substantially on the surface of best focus 416 of the lens 410. In cases where the surface of best focus 416 of the lens 410 has a curved shape other than spherical, such as ellipsoidal, conical, or wavy shaped, the surface 442 of the platform 440 may be shaped accordingly.

Similarly, the plurality of light sources 430 illustrated in FIG. 4 may be replaced by a plurality of detectors, so that a detection surface 432 of each of the plurality of detectors 430 may lie substantially at the surface of best focus 416 of the lens 410. In this configuration, laser pulses reflected off of objects may be brought into near perfect focus by the lens 410 at the detection surface 432 of each detector 430 even if the detector 430 is positioned off from the optical axis 412 of the lens 410.

In some embodiments, a plurality of light sources and a plurality of detectors may share a same lens. The detectors may be placed closely adjacent to their corresponding lasers, such that some of the returning light is intercepted by the detector. Positions either to the side, in front of the laser, or behind the laser are possible. Because the laser beam typically has a narrow angular distribution and only utilizes the central portion of the lens, certain lens aberrations, such as spherical aberration, may be employed to advantage to direct some returning light, from the outer portions of the lens, to the detectors without overly disturbing the focus properties of the outgoing laser beam. In an alternative design, a beam splitter may be utilized to separate the outgoing and incoming beams. This may allow the lasers and detectors to share a conjugate point of the lens without physically overlapping in space.

Figure 5:
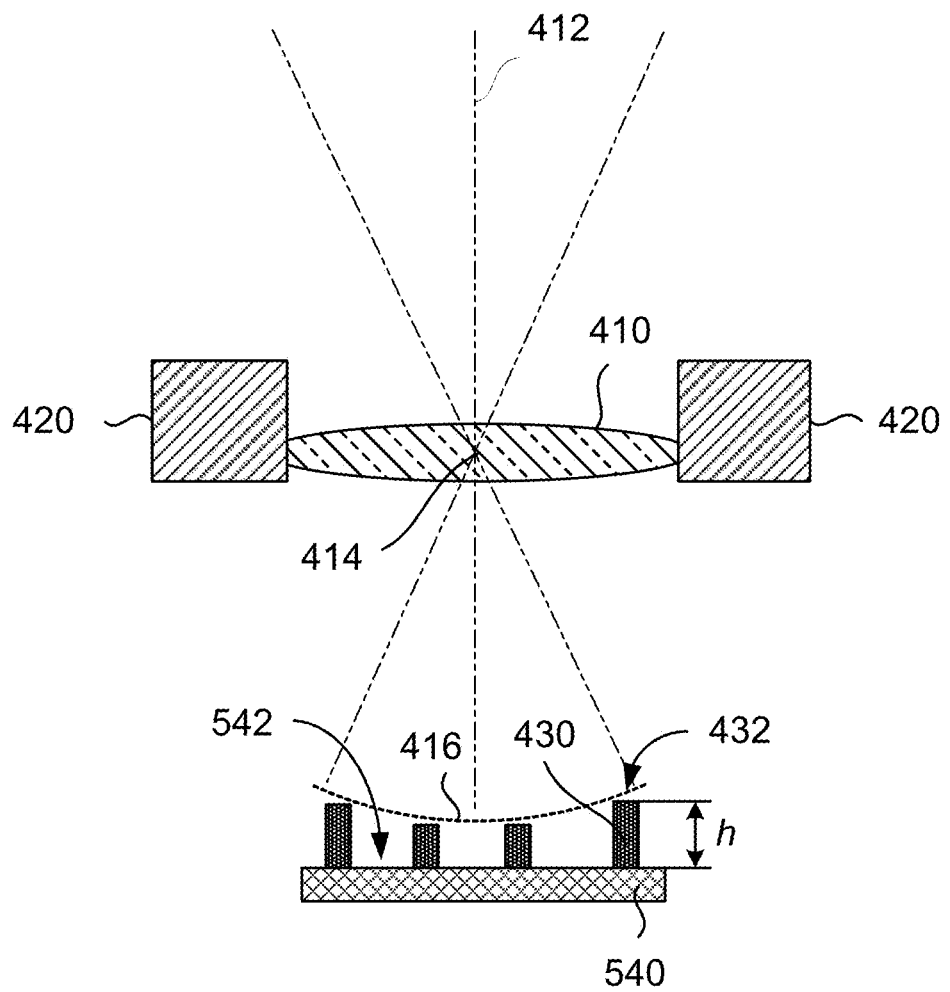
FIG. 5 illustrates a schematic cross-sectional view of a mounting configuration for optoelectronic components in a scanning LiDAR system according to some other embodiments.

FIG. 5 illustrates a schematic cross-sectional view of a mounting configuration for optoelectronic components in a scanning LiDAR system according to some other embodiments. Here, a platform 540 may have a planar surface 542, and the plurality of light sources (or detectors) 430 may be mounted on the planar surface 542 of the platform 540. The plurality of light sources 430 may have varying heights h depending on their positions with respect to the optical axis 412 of the lens 410, such that an emitting surface 432 of each respective light source 430 may lie substantially on the surface of best focus 416 of the lens 410. For example, for a spherical-shaped surface of best focus 416, the light sources 430 farther away from the optical axis 412 may have greater heights than those of the light sources 430 closer to the optical axis 412, as illustrated in FIG. 5, so as to account for the curvature of the surface of best focus 416. As an example, each light source 430 (or detector die) may be placed in a respective surface-mount package that places the die at a respective height h above the bottom of the package. The respective height h may vary depending on the position of the light source 430 (or detector die) with respect to the optical axis 412. The packages are then subsequently soldered to a printed circuit board placed and positioned so that each die is correctly located at an image point of the lens 410.

Figure 6:
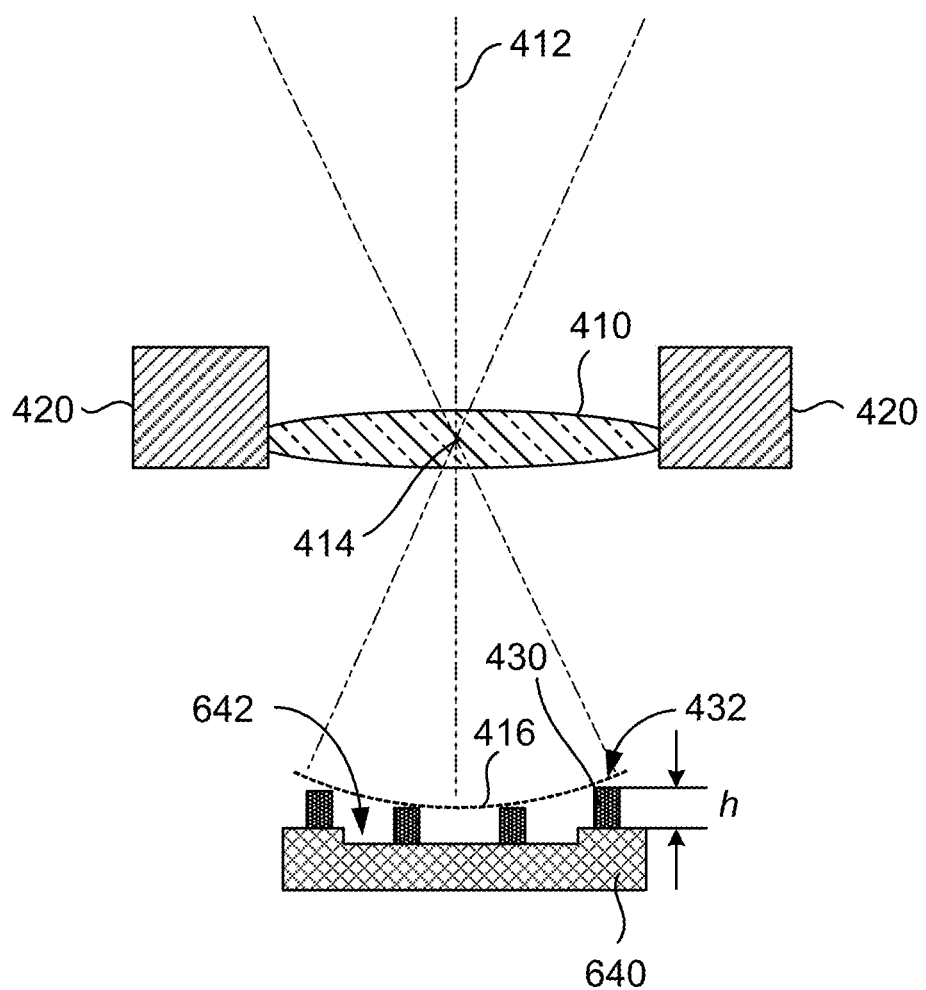
FIG. 6 illustrates a schematic cross-sectional view of a mounting configuration for optoelectronic components in a scanning LiDAR system according to some other embodiments.

FIG. 6 illustrates a schematic cross-sectional view of a mounting configuration for optoelectronic components in a scanning LiDAR system according to some other embodiments. Here, the plurality of light sources (or detectors) 430 may have substantially the same height h. But the platform 640 may have a surface 642 with a stepped profile, such that an emitting surface 432 of each respective light source 430 may lie substantially on the surface of best focus 416 of the lens 410.

Figure 7:
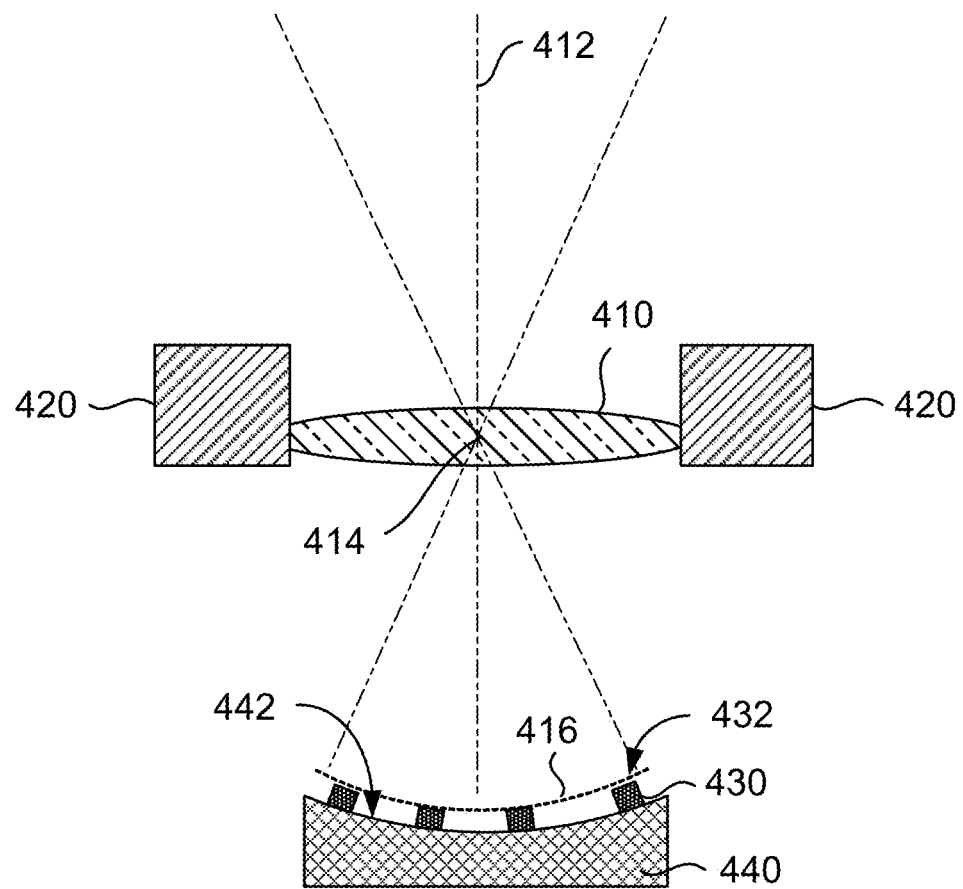
FIG. 7 illustrates a schematic cross-sectional view of a mounting configuration for optoelectronic components in a scanning LiDAR system according to some further embodiments.

In some embodiments, light sources and detectors may be mounted in a configuration that also takes into account possible distortion and vignetting of a lens. FIG. 7 illustrates a schematic cross-sectional view of a mounting configuration for optoelectronic components in a scanning LiDAR system according to some further embodiments. Similar to the mounting configuration illustrated in FIG. 4, a plurality of light sources (or detectors) 430 may be mounted on a curved surface 442 of a platform 440 so that the emission surface 432 of each light source 430 lies substantially at the surface of best focus 416 of the lens 410. In addition, the plurality of light sources 430 are tilted at varying angles, such that a normal of the emission surface 432 of each light source 430 may point substantially toward the lens center 414. In this configuration, laser pulses emitted by light sources 430 that are positioned off from the optical axis 412 may be collimated by the lens 410 with minimal distortion and vignetting. It should be understood that the term "lens center" may refer to the optical center of the lens 410. The lens center 414 may be a geometrical center of the lens 410 in cases where the lens 410 can be characterized as a thin lens. Some compound lenses may be partially telecentric, in which case the preferred orientation of the normal to the laser emission or detector surface may not point toward the geometric center of the lens, but rather the optical center of the lens, which will typically be at an angle closer to the optical axis of the lens.

In some embodiments, a plurality of detectors may be mounted on a planar surface of the platform 440. In some other embodiments, a plurality of detectors may be mounted on the curved surface 442 of the platform 440, so that the detection surface of each detector may point substantially toward the lens center 414. Thus, image rays may impinge on the detectors substantially perpendicular to the detection surfaces of the detectors so that optimal detection efficiencies may be achieved.

Figure 8:
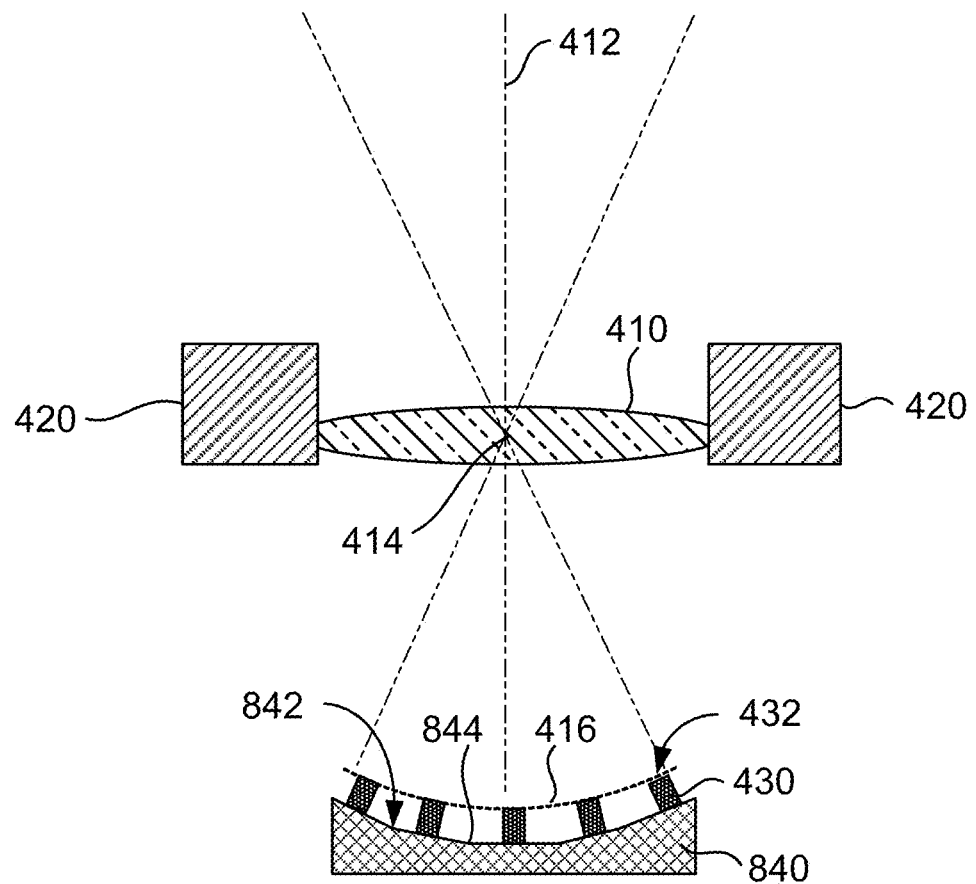
FIG. 8 illustrates a schematic cross-sectional view of a mounting configuration for optoelectronic components in a scanning LiDAR system according to some other embodiments.

FIG. 8 illustrates a schematic cross-sectional view of a mounting configuration for optoelectronic components in a scanning LiDAR system according to some other embodiments. Here, a platform 840 may have a surface 842 that includes a plurality of facets with varying orientations, such that the normal of each facet 844 substantially points toward the lens center 414 of the lens 410. Each of the plurality of light sources may include a surface-emitting laser, such as a vertical-cavity surface-emitting laser (VCSEL), or a side-emitting laser mounted in a package in an orientation such that its light is emitted vertically with respect to the package.

Figure 9:
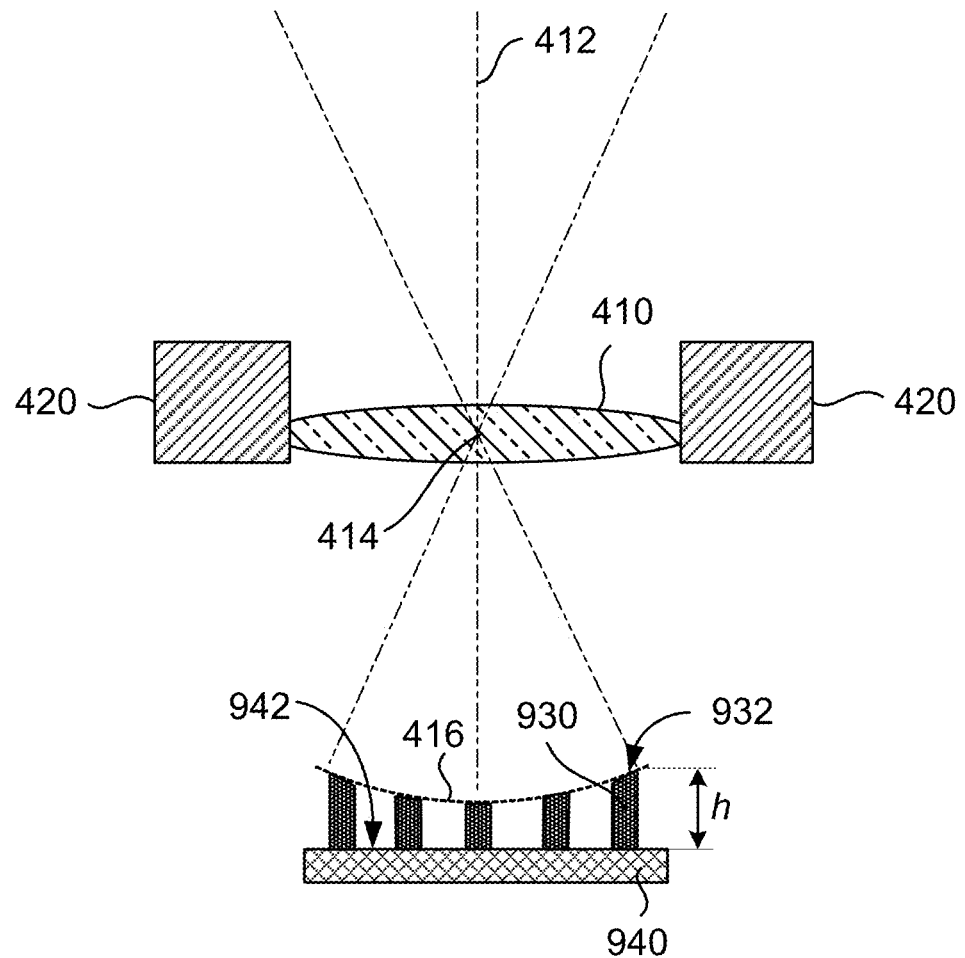
FIG. 9 illustrates a schematic cross-sectional view of a mounting configuration for optoelectronic components in a scanning LiDAR system according to some other embodiments.

FIG. 9 illustrates a schematic cross-sectional view of a mounting configuration for optoelectronic components in a scanning LiDAR system according to some other embodiments. Here, a plurality of light sources 930 are mounted on a platform 940 with a planar surface 942. The plurality of light sources 930 may have varying heights h and varying surface slanting angles depending on the position of each respective light source 930 with respect to the optical axis 412, such that the normal of the emission surface 932 of each respective light source 930 points substantially toward the lens center 414.

Figure 10:
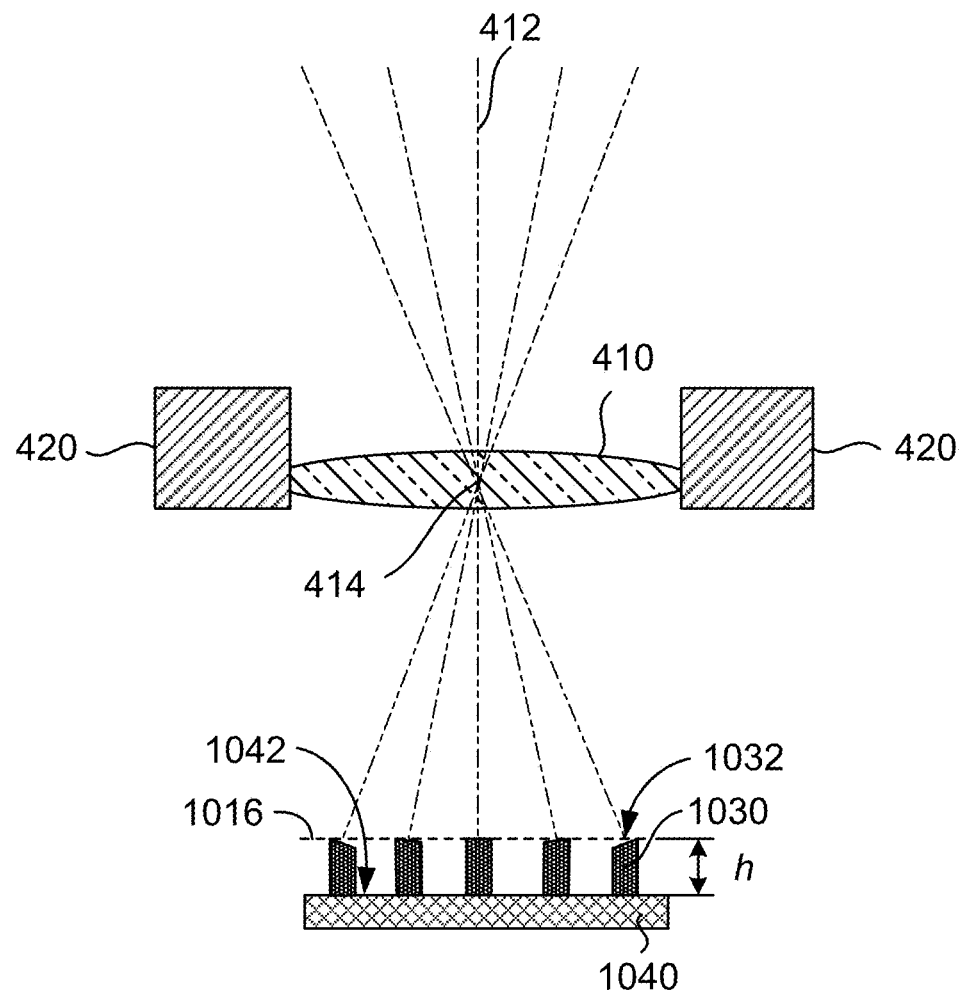
FIG. 10 illustrates a schematic cross-sectional view of a mounting configuration for optoelectronic components in a scanning LiDAR system according to some other embodiments.

FIG. 10 illustrates a schematic cross-sectional view of a mounting configuration for optoelectronic components in a scanning LiDAR system according to some other embodiments. Here, a plurality of light sources 1030 are mounted on a platform 1040 with a substantially planar surface 1042. The plurality of light sources 1030 may have substantially the same height h but varying surface slanting angles depending on the position of each respective light source 1030 with respect to the optical axis 412 of the lens, such that the normal of the emission surface 432 of each respective light source 1030 points substantially toward the lens center 414. As illustrated, the emission surface 1032 of each respective light source 1030 may lie substantially at a focal plane 1016 of the lens 410.

Figure 11:
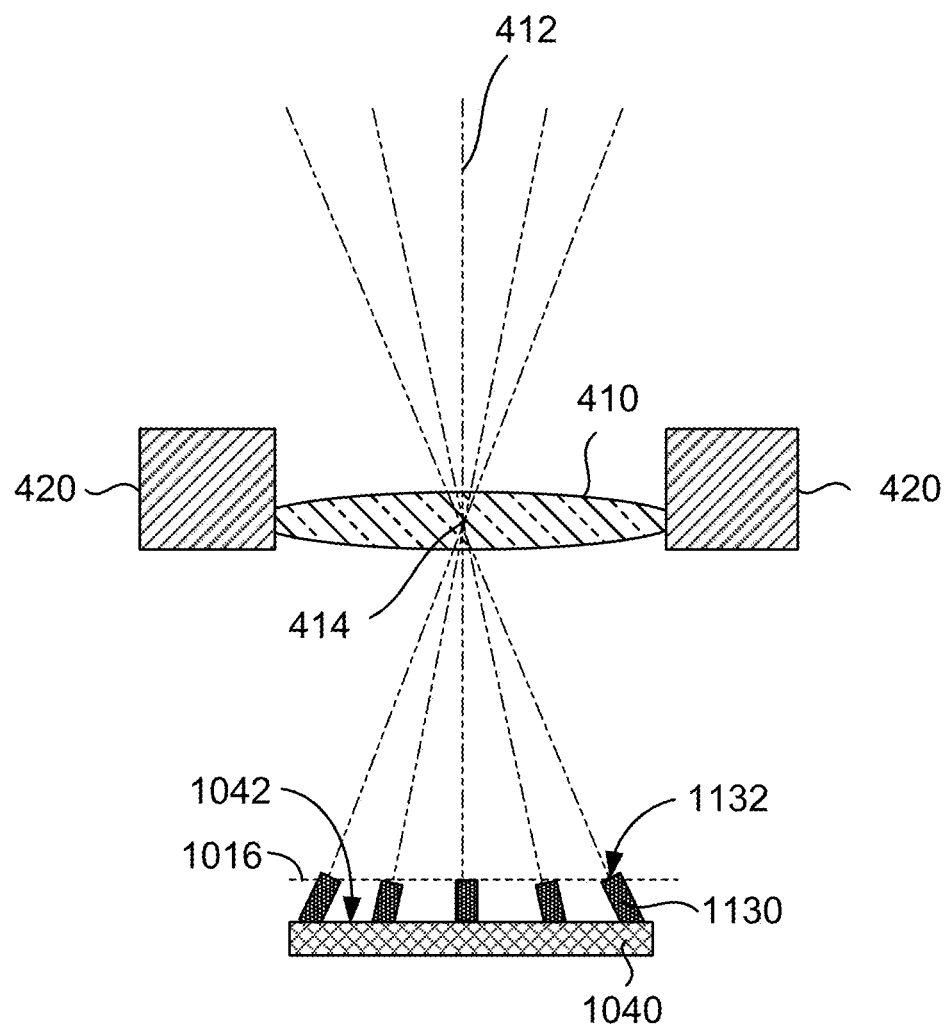
FIG. 11 illustrates a schematic cross-sectional view of a mounting configuration for optoelectronic components in a scanning LiDAR system according to some other embodiments.

FIG. 11 illustrates a schematic cross-sectional view of a mounting configuration for optoelectronic components in a scanning LiDAR system according to some other embodiments. Here, a plurality of light sources 1130 are mounted on a platform 1040 with a substantially planar surface 1042. Each of the plurality of light sources 1130 may be tilted at a respective tilting angle, such that the normal of the emission surface 1132 of each respective light source 1130 points substantially toward the lens center 414. As illustrated, the emission surface 1132 of each respective light source 1130 may lie substantially at a focal plane 1016 of the lens 410.

Figure 12:
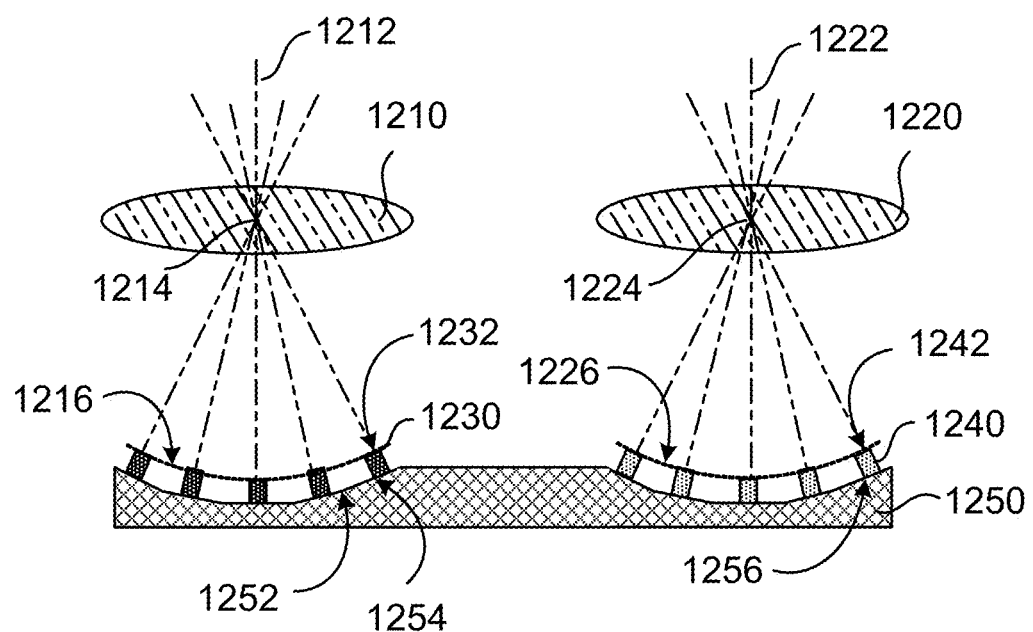
FIG. 12 illustrates a schematic cross-sectional view of a mounting configuration for optoelectronic components in a scanning LiDAR system according to some other embodiments.

FIG. 12 illustrates a schematic cross-sectional view of a mounting configuration for optoelectronic components in a scanning LiDAR system according to some other embodiments. The LiDAR system may include a first lens 1210 and a second lens 1220. The first lens 1210 has a lens center 1214, and is characterized by a first optical axis 1212 along a first direction and a first surface of best focus 1216. The second lens 1220 has a lens center 1224, and is characterized by a second optical axis 1222 substantially parallel to the first optical axis 1212 and a second surface of best focus 1226.

The LiDAR system may further include a plurality of surface-emitting light sources 1230 and a plurality of detectors 1240 mounted on a platform 1250. In some embodiments, the platform 1250 is a printed circuit board. The platform 1250 is spaced apart from the first lens 1210 and the second lens 1220 along the first direction. In some embodiments, the platform 1250 may have a surface 1252 (extending substantially in the direction perpendicular to the paper, i.e., the Z direction) that includes a plurality of first facets 1254. Each surface-emitting light source 1230 may be mounted on a respective first facet 1254. The plurality of first facets 1254 may be positioned and oriented such that an emission surface 1232 of each respective light source 1230 lies substantially at the first surface of best focus 1216 of the first lens 1210 and its normal points substantially toward the lens center 1214 of the first lens 1210. The surface 1252 of the platform 1250 may further include a plurality of second facets 1256. Each detector 1240 may be mounted on a respective second facet 1256. The plurality of second facets 1256 may be positioned such that a detection surface 1242 of each respective detector 1240 lies at a respective position on the second surface of best focus 1226 of the second lens 1220 that is optically conjugate with a respective position of a corresponding light source 1230. The plurality of second facets 1256 may be oriented such that the normal of the detection surface 1242 may point substantially toward the lens center 1224 of the second lens 1220.

Figure 13:
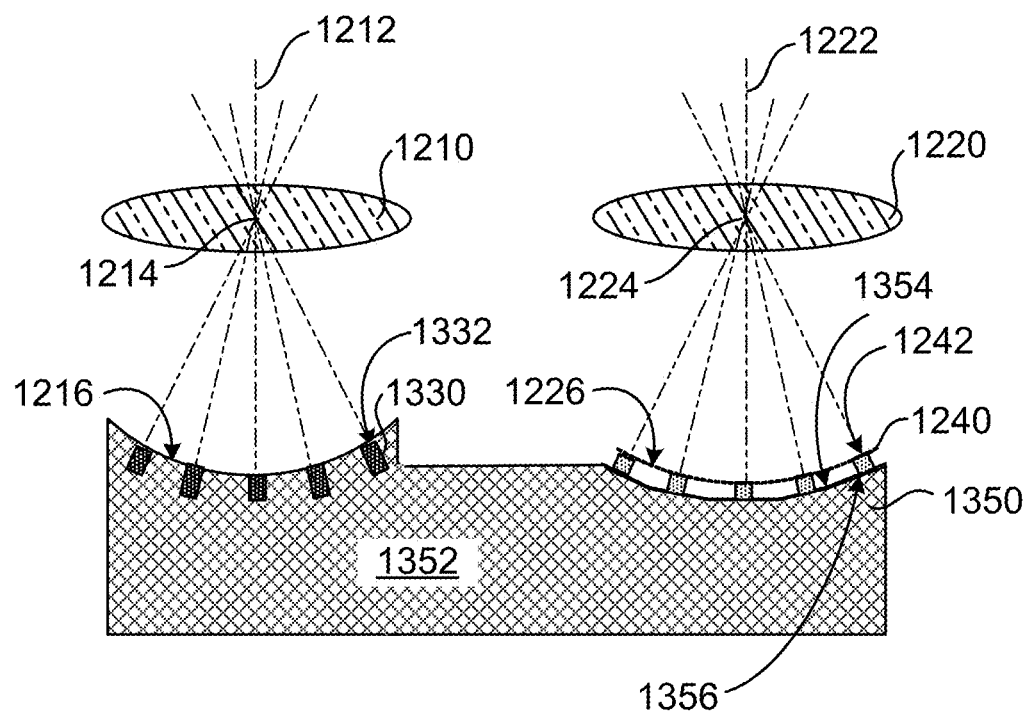
FIG. 13 illustrates a schematic top view of a mounting configuration for optoelectronic components in a scanning LiDAR system according to some other embodiments.
Figure 13:
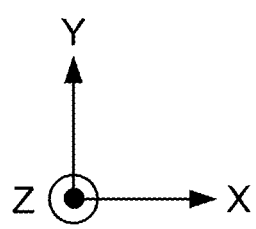
Figure 14:
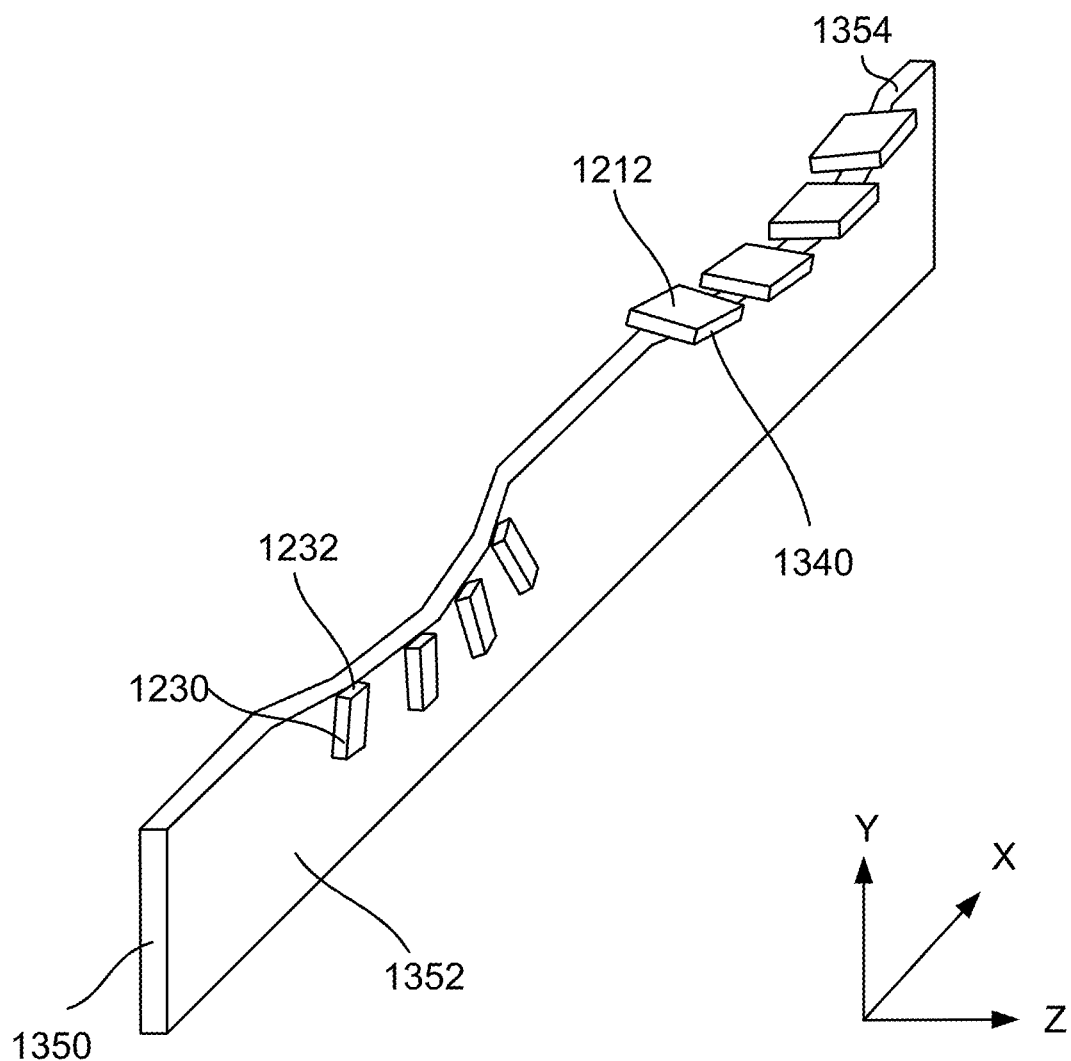
FIG. 14 shows a schematic perspective view of the platform with the plurality of light sources and the plurality of detectors mounted thereon as illustrated in FIG. 13.

FIG. 13 illustrates a schematic top view of a mounting configuration for optoelectronic components in a scanning LiDAR system according to some other embodiments. Here, a platform 1350 (e.g., a printed circuit board) may have a planar surface 1352 in the X-Y plane (i.e., in the plane of the paper), and an edge surface 1354 extending in the Z direction (i.e., in a direction perpendicular to the paper). FIG. 14 shows a schematic perspective view of the platform 1350 with the plurality of light sources 1230 and the plurality of detectors 1240 mounted thereon as illustrated in FIG. 13. Each of the plurality of edge-emitting light sources 1330 may comprise an edge-emitting light source. The plurality of light sources 1330 may be disposed on the planar surface 1352 of the platform 1350 as an array along an arc such that an emission surface 1332 of each respective light source 1330 lies substantially at the surface of best focus 1216 of the first lens 1210, and its normal pointing substantially toward the lens center 1214 of the first lens 1210. The edge surface 1354 of the platform 1350 may include a plurality of facets 1356. Each detector 1240 may be mounted on a respective facet 1356 of the edge surface 1354. The plurality of facets 1356 may be positioned such that a detection surface 1242 of each respective detector 1240 lies at a respective position on the surface of best focus 1226 of the second lens 1220 that is conjugate with a respective position of a corresponding light source 1330. The plurality of second facets 1356 may be oriented such that the normal of the detection surface 1242 may point substantially toward the lens center 1224 of the second lens 1220.

In high-volume productions of LiDAR systems, to precisely place individual light sources and detectors at the desired positions and orientations can be time consuming. Thus, there is a need for low cost and precise automated placement of the light sources and the detectors. In some embodiments, an array of light sources and/or detectors are placed into a surface-mount device (SMD) package. The SMD package may be designed to be directly soldered onto a printed circuit board (PCB). The light sources and/or detectors may be positioned in the SMD package at different heights to mitigate the effect of field curvature of an emission lens or an receiving lens, and may also be oriented so that they point substantially toward the center of the emission lens or the receiving lens, as discussed above with reference to FIGS. 4-14.

Figure 15A:
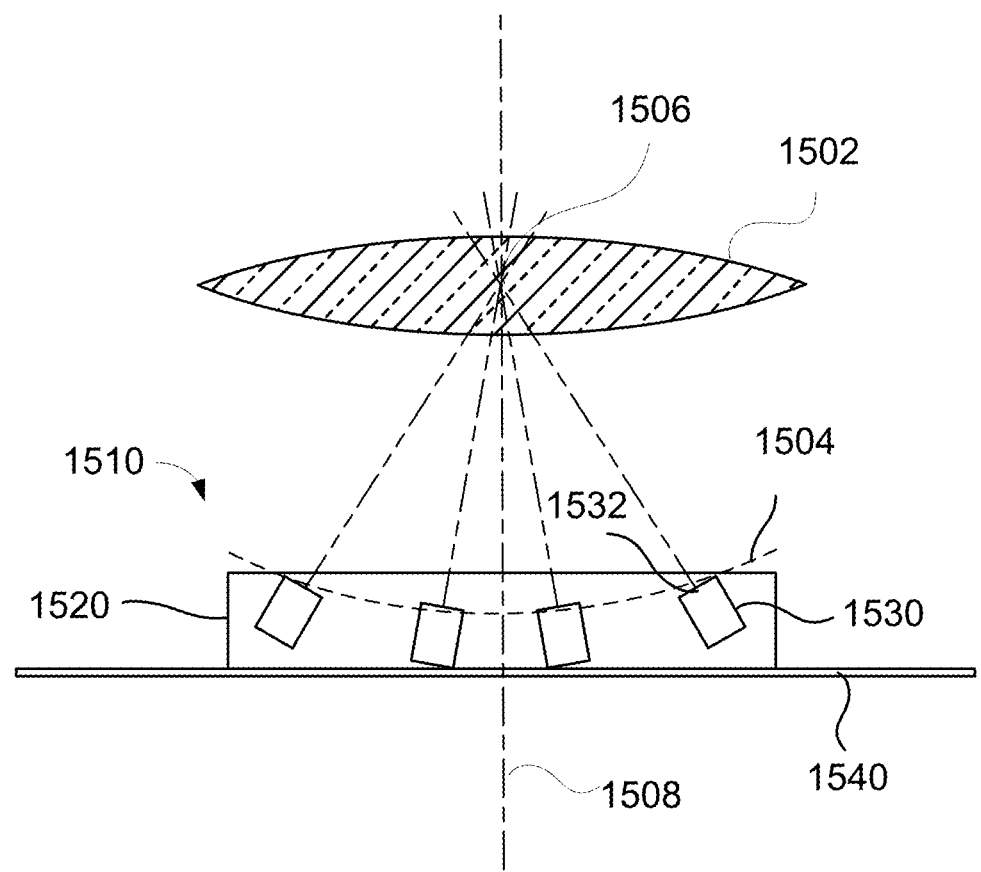
FIG. 15A shows a cross-sectional view of an optoelectronic package for a LiDAR system according to some embodiments.
Figure 15B:
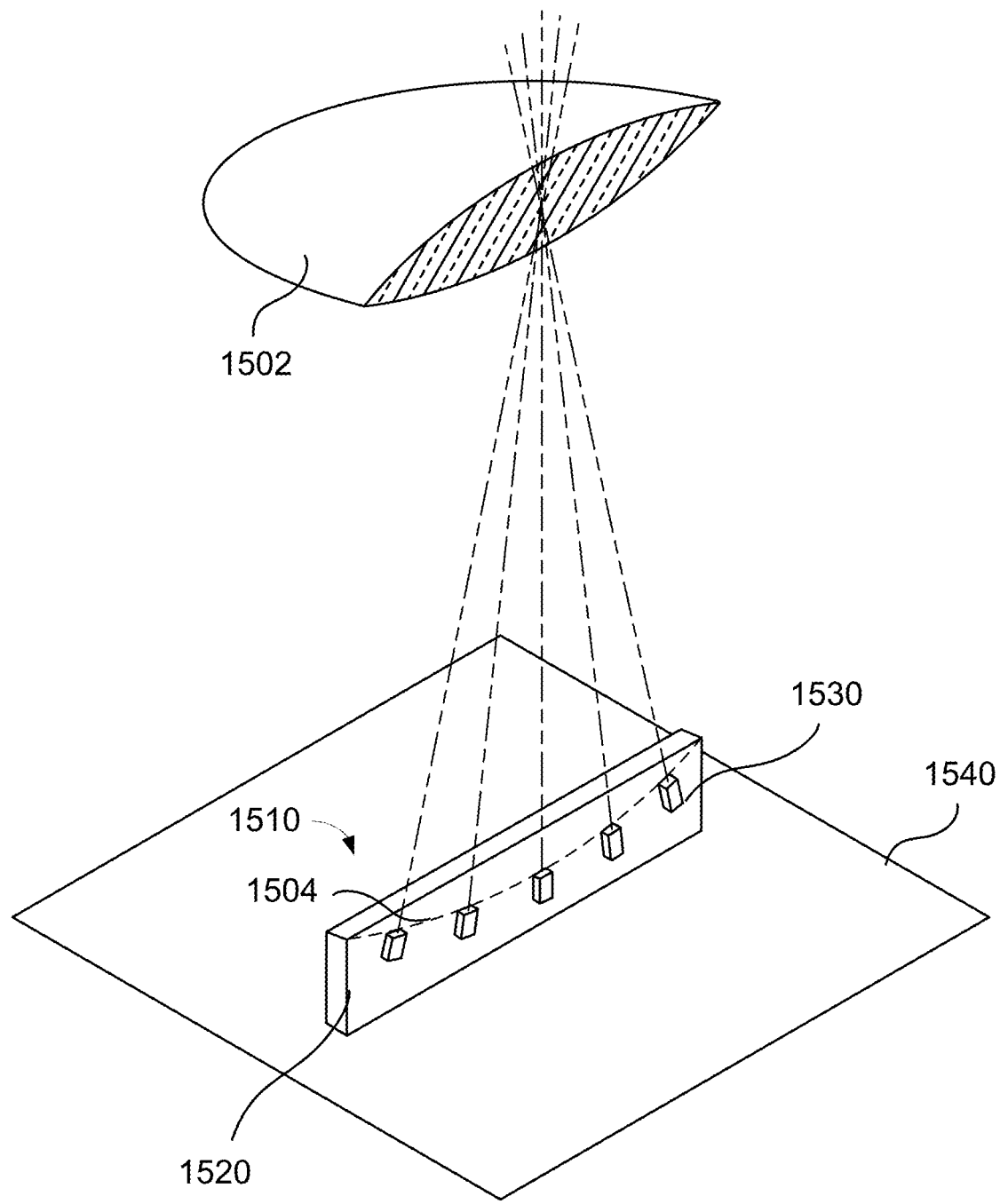
FIG. 15B shows a perspective view of the optoelectronic package illustrated in FIG. 15A.

FIG. 15A shows a cross-sectional view of an optoelectronic package 1510 for a LiDAR system according to some embodiments. FIG. 15B shows a perspective view of the optoelectronic package 1510. Referring to FIG. 15A, the LiDAR system includes an optical lens 1502. For example, the optical lens 1502 may be the emission lens 130 or the receiving lens 140 in the LiDAR system 100 illustrated in FIG. 1. The optical lens 1502 may be characterized by an optical axis 1508, a lens center 1506, and a surface of best focus 1504. It should be noted that, although a single-element optical lens is illustrated in FIG. 15A, the optical lens 1502 may comprise a compound lens that includes multiple optical elements. For a thick lens or a compound lens, the term "lens center" may refer to a principal point of the optical lens 1502. The term "surface of best focus" may refer to a "focal plane" of the optical lens 1502. The "focal plane" may be curved due to field curvature. It should be noted that, although the surface of best focus 1504 is illustrated in FIG. 15A as substantially a spherical surface, the surface of best focus 1504 can have shapes other than spherical. For example, for a compound lens, the surface of best focus 1504 may have a complex or irregular shape.

The optoelectronic package 1510 may include a substrate 1520 spaced apart from the optical lens 1502 along the optical axis 1508, and a plurality of optoelectronic components 1530 embedded therein. The plurality of optoelectronic components 1530 may be positioned on the substrate 1520 at specific heights, such that a surface 1532 of each respective optoelectronic component 1530 lies on the surface of best focus 1504 of the optical lens 1502. Each optoelectronic component 1530 may be a light source or a detector. By positioning the optoelectronic components 1530 in this configuration, the effect of field curvature of the optical lens 1502 may be mitigated. For example, in cases in which an optoelectronic component 1530 is a light source, a laser beam emitted by the light source may be relatively well collimated by the optical lens 1502 even if the light source is positioned off of the optical axis 1508 of the optical lens 1502. Similarly, in cases in which an optoelectronic component 1530 is a detector, a return light beam may be relatively well focused by the optical lens 1502 onto the surface 1532 of the detector. Alternatively or additionally, the plurality of optoelectronic components 1530 may be positioned on the substrate 1520 at specific orientations, such that each optoelectronic component 1530 points substantially toward the lens center 1506. In the case of a lens that is partially or fully telecentric, this angle from the laser (or detector) to the effective lens center may be different than the angle from the lens to the object.

Note that four optoelectronic components 1530 are illustrated in the optoelectronic package 1510 shown in FIG. 15A, and five optoelectronic components 1530 are illustrated in the optoelectronic package 1510 shown in FIG. 15B. The number of optoelectronic components 1530 in the optoelectronic package 1510 may be varied to either smaller or larger according to the needs and designs of the LiDAR system.

In some embodiments, the plurality of optoelectronic components 1530 may include a plurality of light sources. In such cases, the optical lens 1502 may serve as an emission lens, such as the emission 130 in the LiDAR system 100 illustrated in FIG. 1. In some embodiments, the plurality of optoelectronic components 1530 may include a plurality of detectors. In such case, the optical lens 1502 may serve as a receiving lens, such as the receiving lens 140 in the LiDAR system 100 illustrated in FIG. 1.

In some embodiments, the plurality of optoelectronic components 1530 may include one or more light sources and one or more detectors, similar to the transceiver array in the LiDAR system 300 illustrated in FIG. 3. In such cases, the optoelectronic package 1510 may be referred to as a transceiver package.

Figure 16:
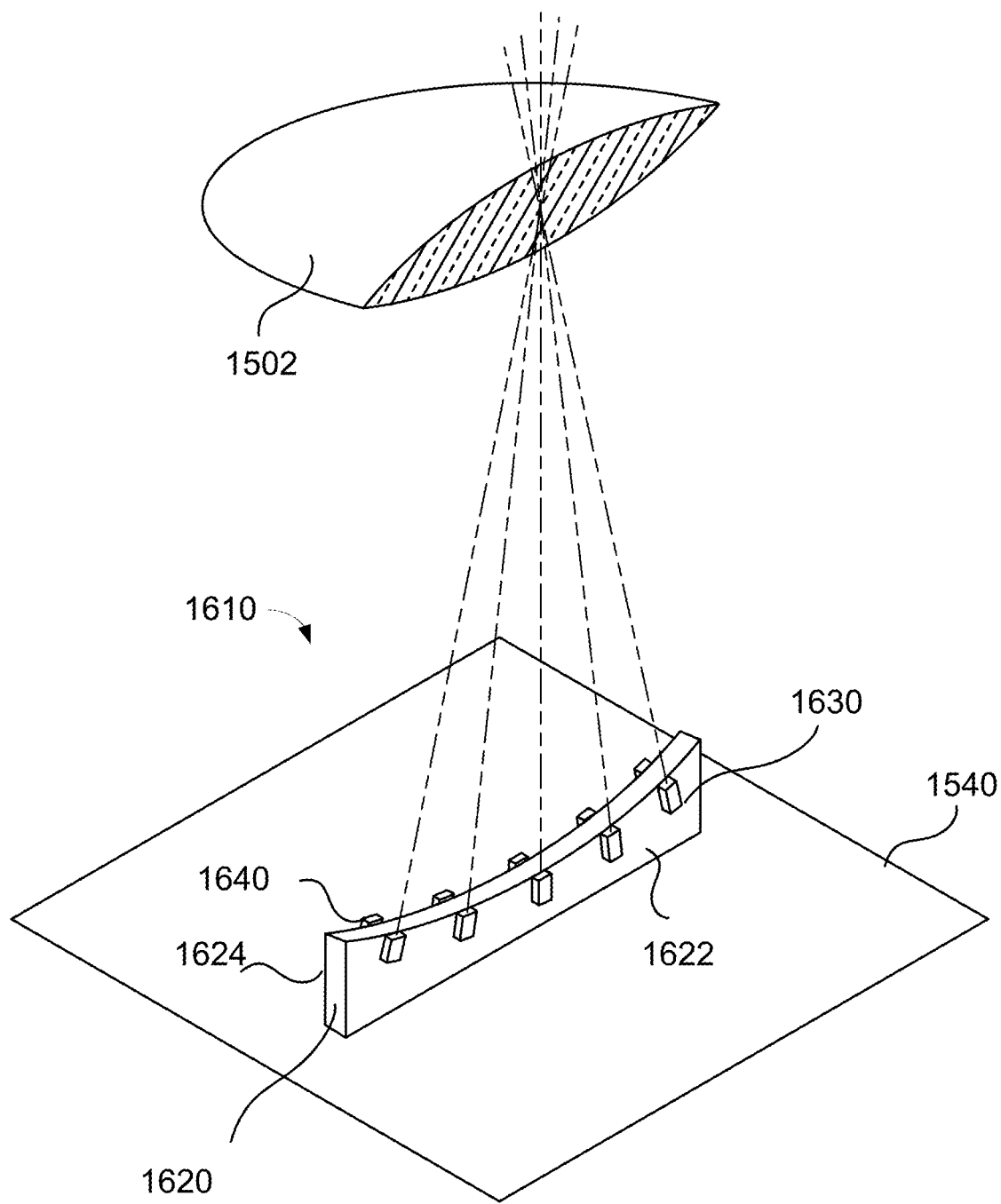
FIG. 16 illustrates a perspective view of an optoelectronic package for a LiDAR system according to some embodiments.

FIG. 16 illustrates a perspective view of an optoelectronic package 1610 for a LiDAR system according to some embodiments. The optoelectronic package 1610 includes a substrate 1620 that includes a first surface 1622 and a second surface 1624 (hidden from view in FIG. 16) opposite to the first surface 1622. The optoelectronic package 1610 includes a plurality of light sources 1630 mounted on the first surface 1622 of the substrate 1620, and a plurality of detectors 1640 mounted on the second surface 1624 of the substrate.

The optoelectronic package 1610 that includes both light sources 1630 and detectors 1640 in the same package may afford several advantages. For example, it may allow more precise alignment between the light sources 1630 and the detectors 1640. In addition, a higher packing density of the light sources 1630 and the detectors 1640 may be achieved. Also, by interspersing light sources 1630 and detectors 1640, the light sources 1630 may be effectively spread out over a larger area, which may allow for higher total light power levels without exceeding eye safe limits.

In some embodiments, the optoelectronic package 1510 may be configured as a surface mount device (SMD) package. For example, wire bonds, conductive epoxy, or solder may be used to electrically connect each optoelectronic component 1530 (e.g., laser or detector) to the SMD package. Metal traces in the SMD package then connect to metal pads or contact pins on the bottom of the package that allow the SMD to be soldered to a printed circuit board (PCB) 1540.

Figure 17A:
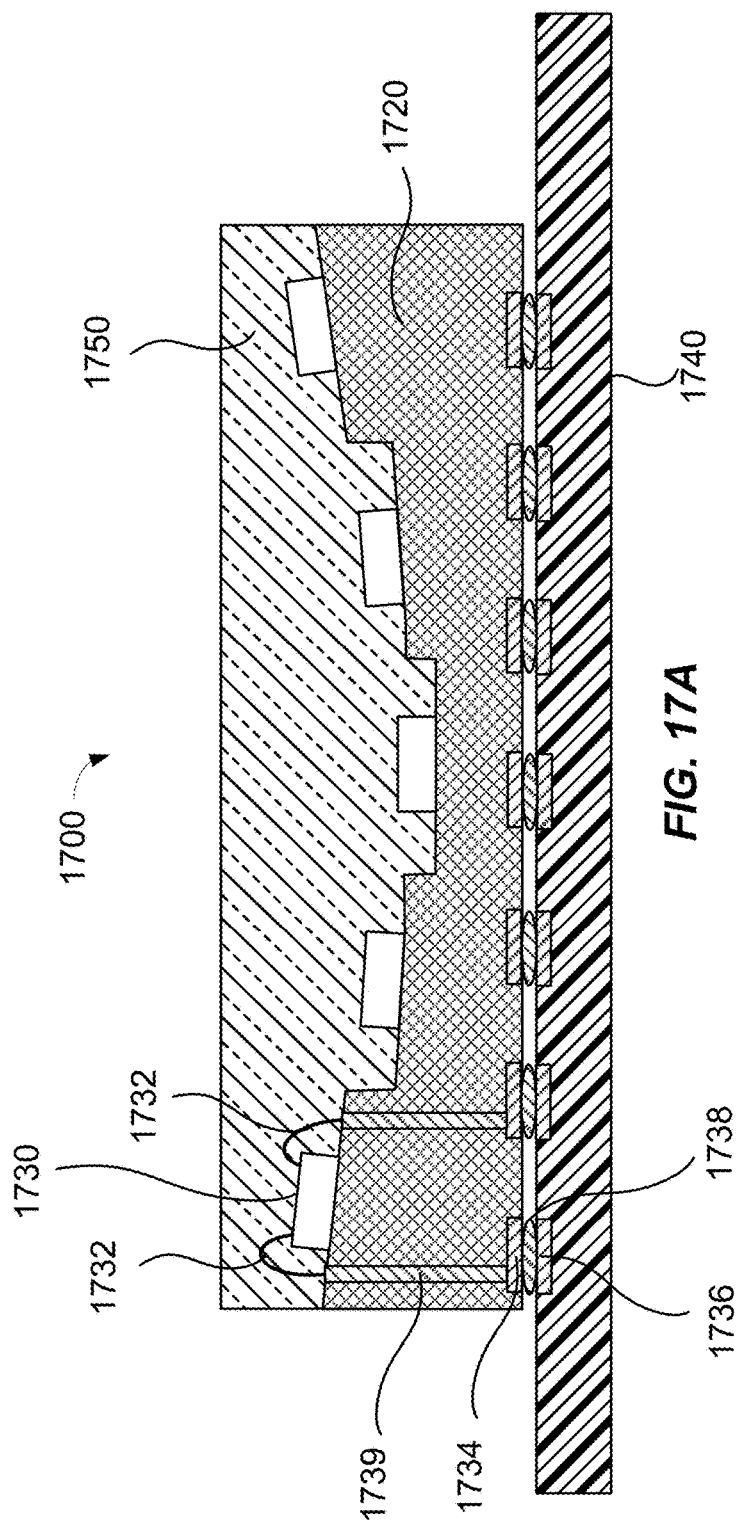
FIG. 17A shows a schematic cross-sectional view of a SMD package according to some embodiments.
Figure 17B:
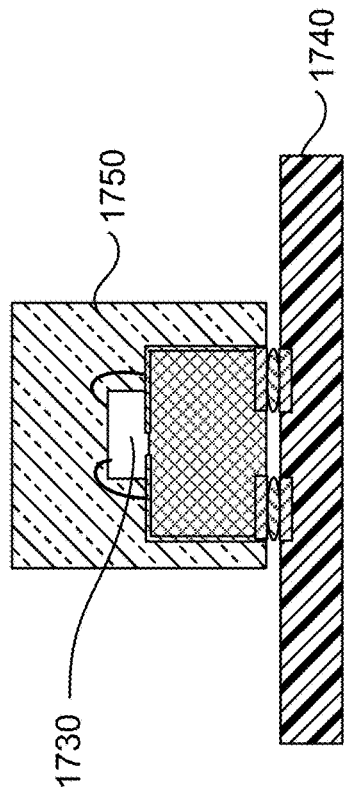
FIG. 17B shows an end view of the SMD package illustrated in FIG. 17A.

FIG. 17A shows a schematic cross-sectional view of a SMD package 1700 according to some embodiments. FIG. 17B shows an end view of the SMD package 1700. The SMD package 1700 includes a substrate 1720, and a plurality of optoelectronic components 1730 (e.g., light sources and/or detectors) positioned on the substrate 1720 at specific heights and orientations, as discussed above. In some embodiments, the optoelectronic components 1730 may comprise semiconductor chips.

The bottom of the substrate 1720 may have solder pads 1734 formed thereon. Each optoelectronic component 1730 may have wire bonds 1732 that are electrically connected to the solder pads 1734 via vias 1739 through the substrate 1720. The SMD package 1700 may be attached to a PCB board 1740. A top surface of the PCB board 1740 may have solder pads 1736 formed thereon that correspond to the solder pads 1734 at the bottom of the substrate 1720. Thus, the SMD package 1700 may be mechanically and electrically coupled to the PCB board 1740 via solder 1738 between the solder pads 1736 at the bottom of the substrate 1720 and the solder pads 1736 at the top of the PCB 1740. The SMD package 1700 may be designed to be soldered onto the surface of the PC 1740 using automated pick and place robots and wave soldering techniques for high volume manufacturing.

The SMD package 1700 may be encapsulated by a clear encapsulant 1750, such as epoxy, plastic, or the like. The encapsulant 1750 may cover the top, as well as the sides of the SMD package 1700. The encapsulant 1750 may protect the optoelectronic components 1730 from the environment. In some embodiments, the area over the optoelectronic components 1730 may be covered with a protective glass plate, or may be left unprotected, so that the light sources may emit light out of the SMD package 1700, and detectors may receive light into the SMD package 1700. In some embodiments, the SMD package 1700 may also include lenses to help collimate laser beams or shape the laser beams (e.g., making them more geometrically symmetric). In some embodiments, the SMD package 1700 may also include a filter, for example, to block sunlight and other unwanted light from disturbing the detectors.

Figure 18A:
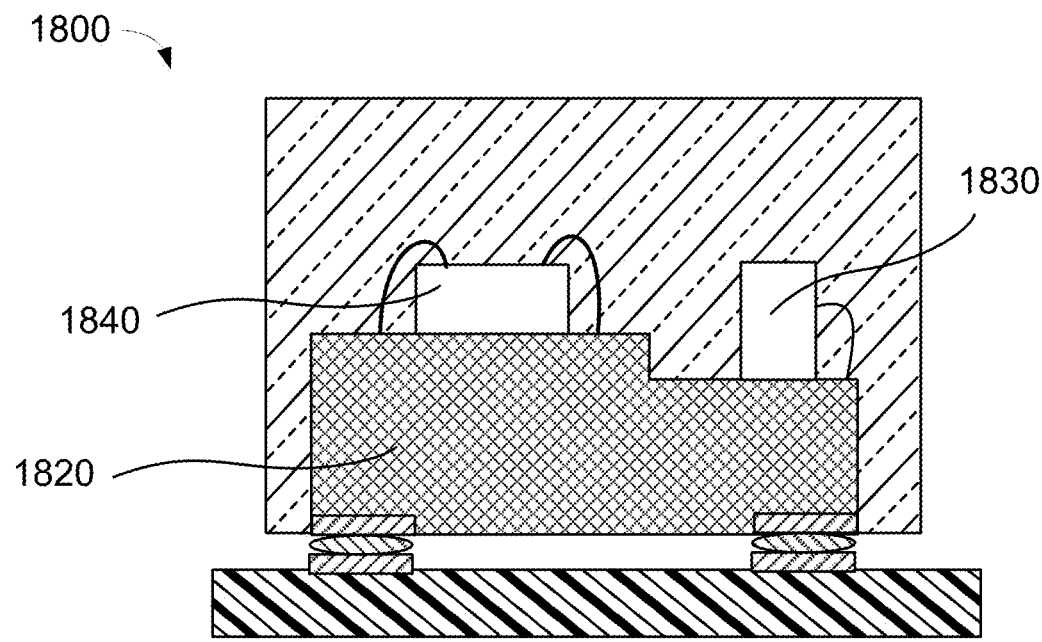
FIG. 18A shows an end view of an SMD package according to some embodiments.

FIG. 18A shows an end view of an SMD package 1800 according to some embodiments. The SMD package 1800 may comprise a transceiver package that includes a plurality of light sources 1830 (e.g., disposed as an array in the direction perpendicular to the page) and a plurality of detectors 1840 (e.g., disposed as an array in the direction perpendicular to the page). The light sources 1830 and the detectors 1840 may be mounted on a top surface of a substrate 1820. In some embodiments, the height of each light source 1830 may be different from the height of each detector 1840. In such cases, the top surface of the substrate 1820 may be stepped, so that a top surface of each light source 1830 and a stop surface of each detector 1840 may lie on the same plane (e.g., the surface of best focus) of a transceiver lens.

Figure 18B:
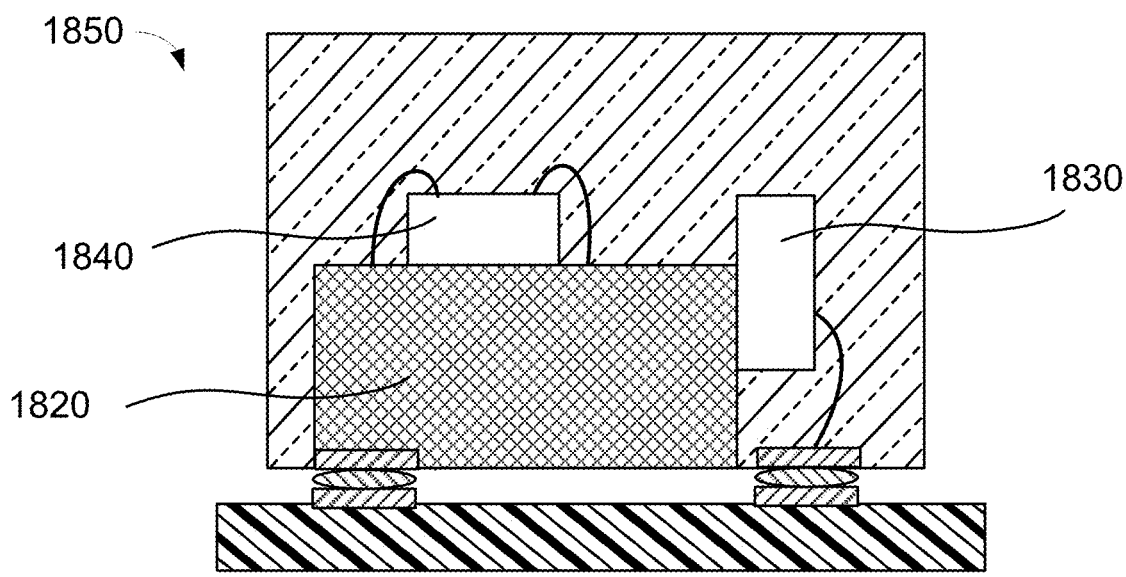
FIG. 18B shows an end view of an SMD package according to some embodiments.

FIG. 18B shows an end view of an SMD package 1850 according to some embodiments. The SMD package 1800 is similar to the SMD package 1800 illustrated in FIG. 18A, except that the light sources 1830 are attached to a side wall of the substrate 1820. The light sources 1830 may be positioned so that a top surface of each light source 1830 and a stop surface of each detector 1840 may lie on the same plane (e.g., the surface of best focus) of a transceiver lens.

Figure 19:
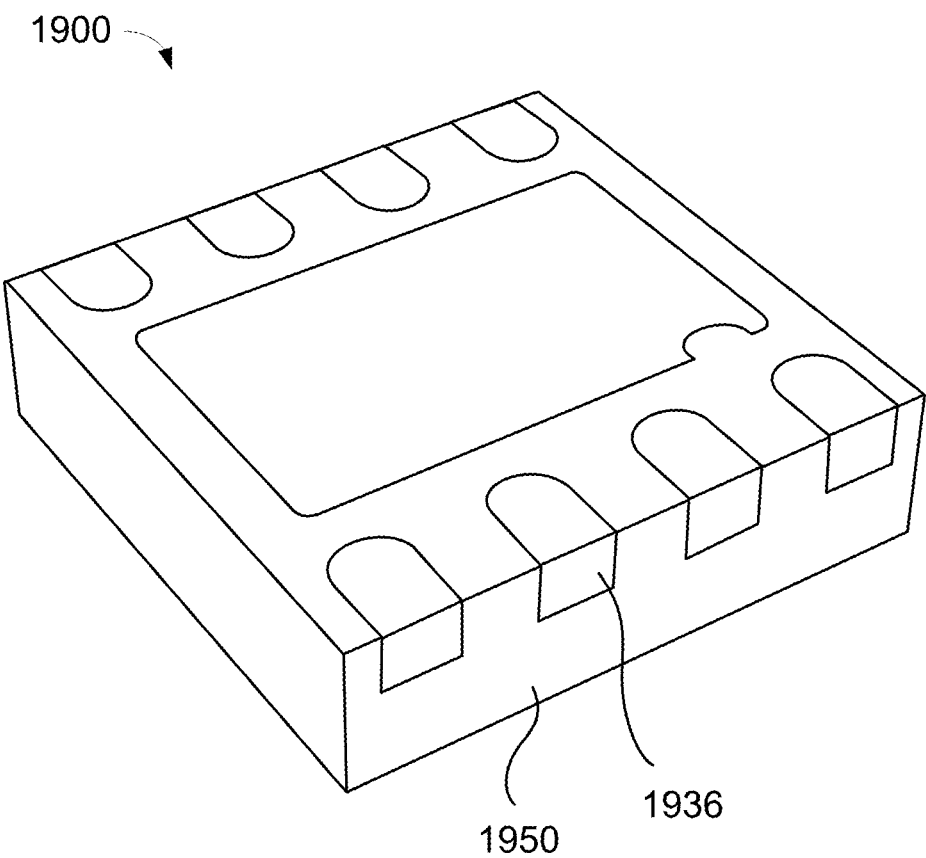
FIG. 19 shows an underside of an SMD package according to some embodiments.

FIG. 19 shows an underside of an SMD package 1900 according to some embodiments. The SMD package 1900 includes solder pads 1936 on its bottom surface for soldering to a PCB. The SMD package 1900 may include a clear plastic or glass cover 1950 covering the optoelectronic components.

Figure 20:
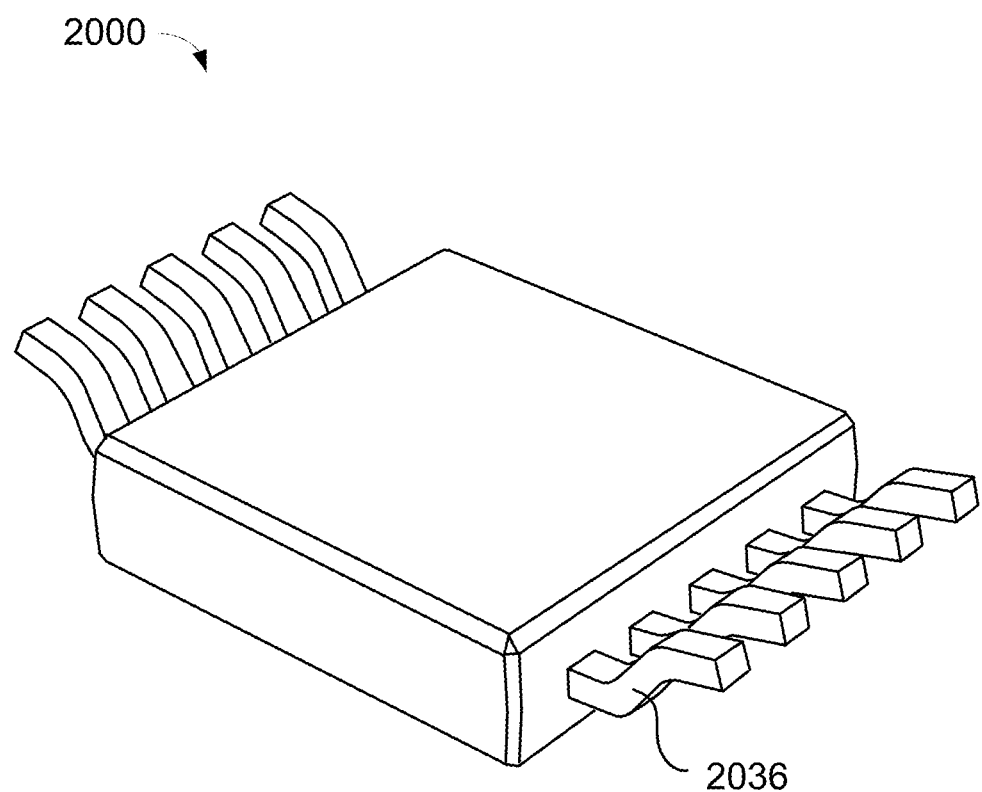
FIG. 20 shows an SMD package according to some embodiments.

FIG. 20 shows an SMD package 2000 according to some embodiments. Here, the SMD package 2000 includes metal leads 2036, instead of solder pads, for soldering to a PCB.

In some LiDAR implementations, a two-dimensional array of light sources and a two-dimensional array of detectors may be used. According to some embodiments, multiple SMD packages, each SMD package including a one-dimensional array of optoelectronic components, may be arranged on a PCB board to form a two-dimensional array.

Figure 21A:
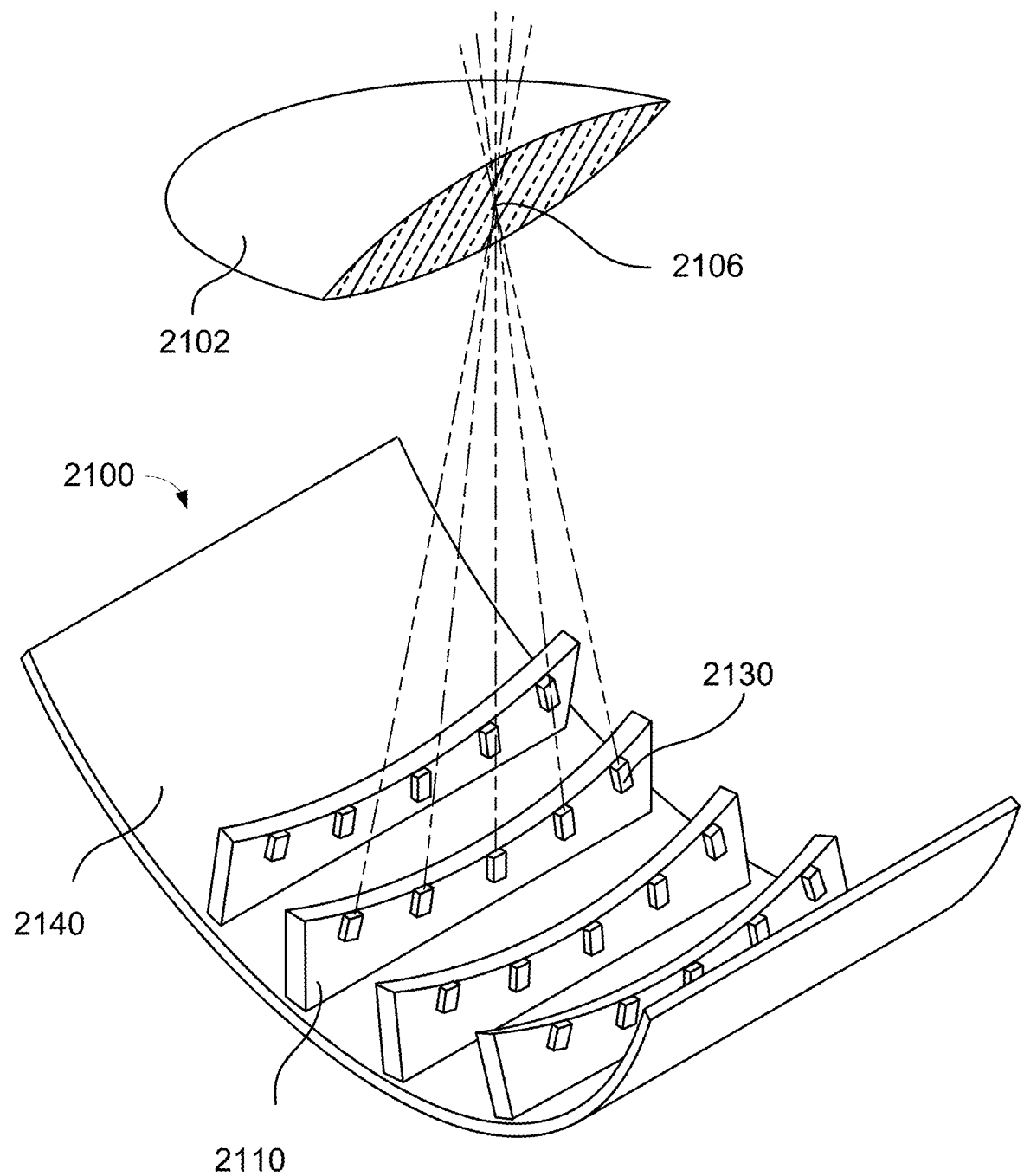
FIG. 21A shows an exemplary two-dimensional optoelectronic array for a LiDAR system according to some embodiments.

FIG. 21A shows an exemplary two-dimensional optoelectronic array 2100 for a LiDAR system according to some embodiments. The optoelectronic array 2100 includes a plurality of SMD packages 2110 attached to a PCB 2140. Each SMD package 2110 includes a one-dimensional array of optoelectronic components 2130 (e.g., light sources or detectors, or combination of light sources and detectors), similar to the optoelectronic package 1510 shown in FIG. 15B. The PCB 2140 is curved (e.g., like a cylindrical surface), so that all optoelectronic components 2130 of the different SMD packages 2110 may have their surfaces lying on the surface of best focus of the optical lens 2102, and/or point substantially toward the lens center 2106. In some embodiments, the PCB 2140 may comprise a flexible PCB.

Figure 21B:
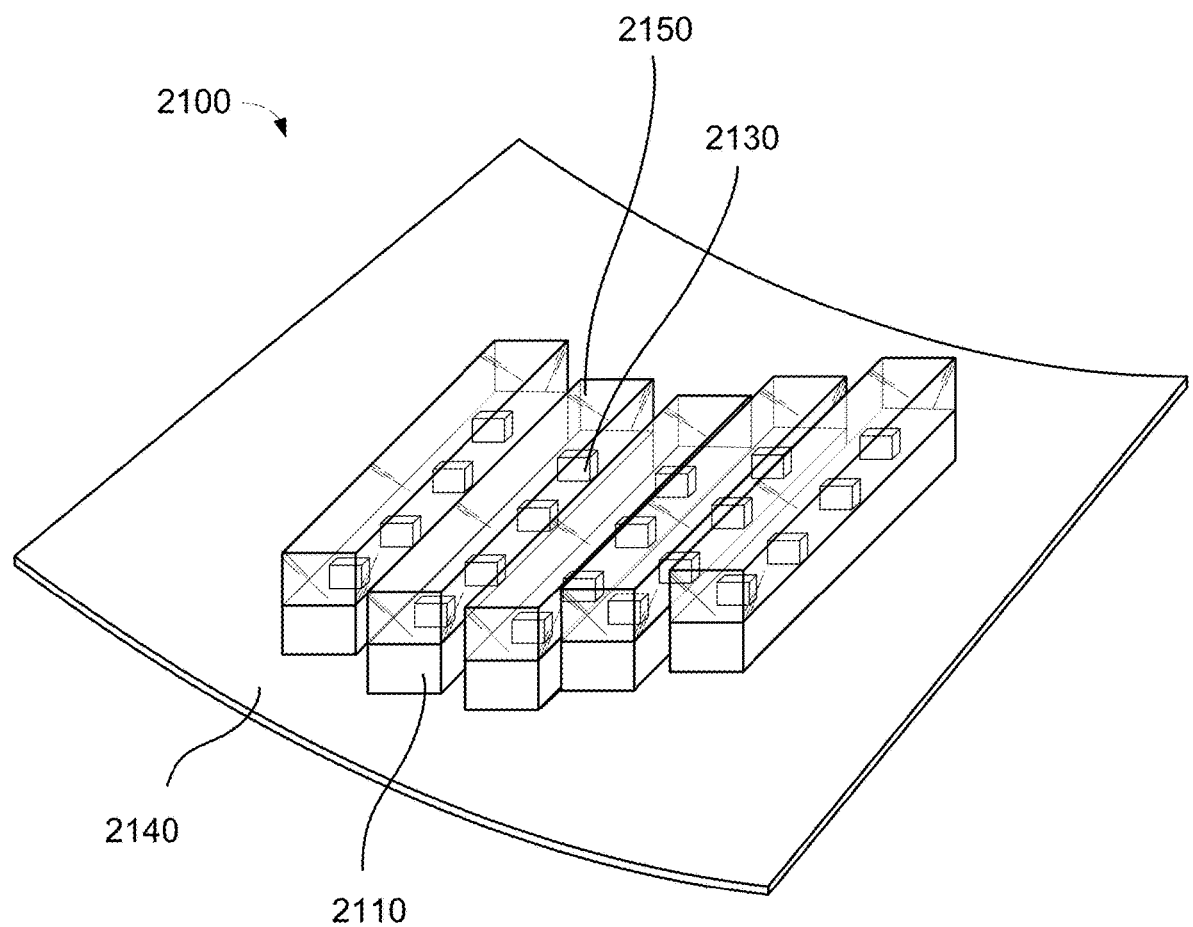
FIG. 21B shows a two-dimensional optoelectronic array according to some embodiments.

FIG. 21B shows the two-dimensional optoelectronic array 2100, in which each SMD package 2110 includes a clear encapsulant 2150 that covers the optoelectronic components 2130.

Figure 22A:
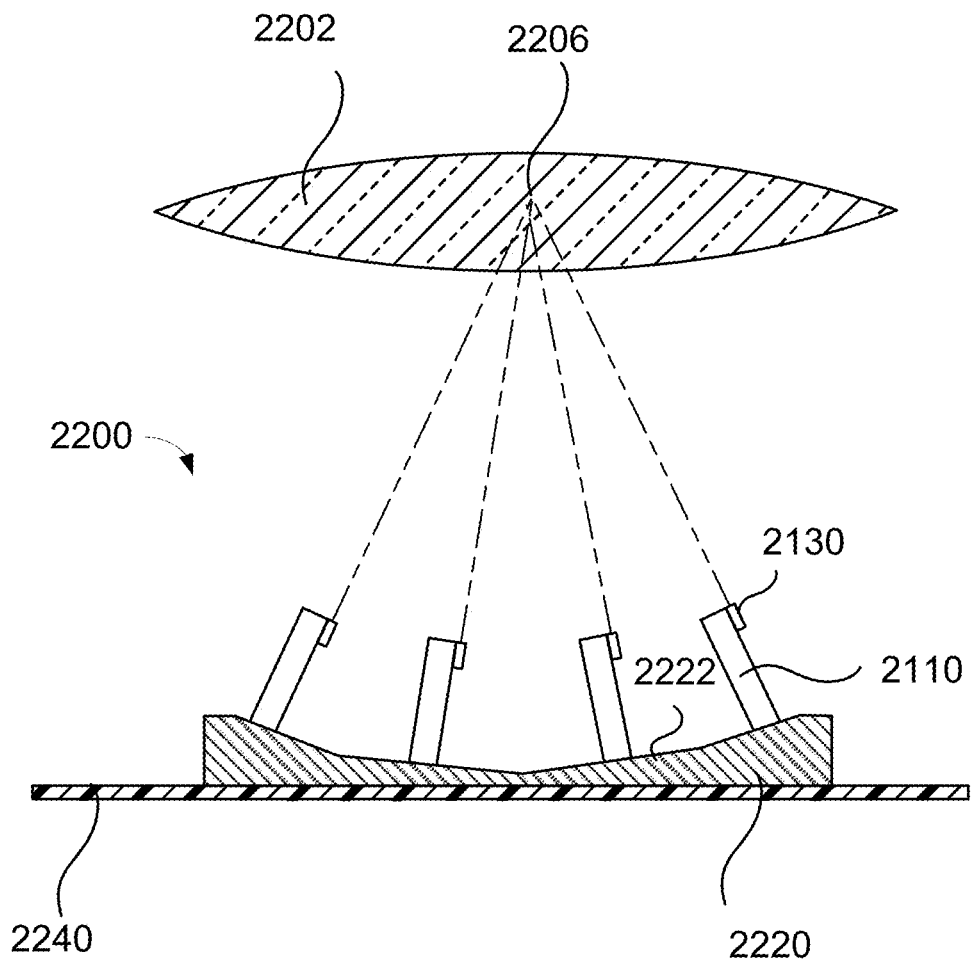
FIGS. 22A and 22B show a cross-sectional view and a perspective view, respectively, of an exemplary two-dimensional optoelectronic array for a LiDAR system according to some embodiments.
Figure 22B:
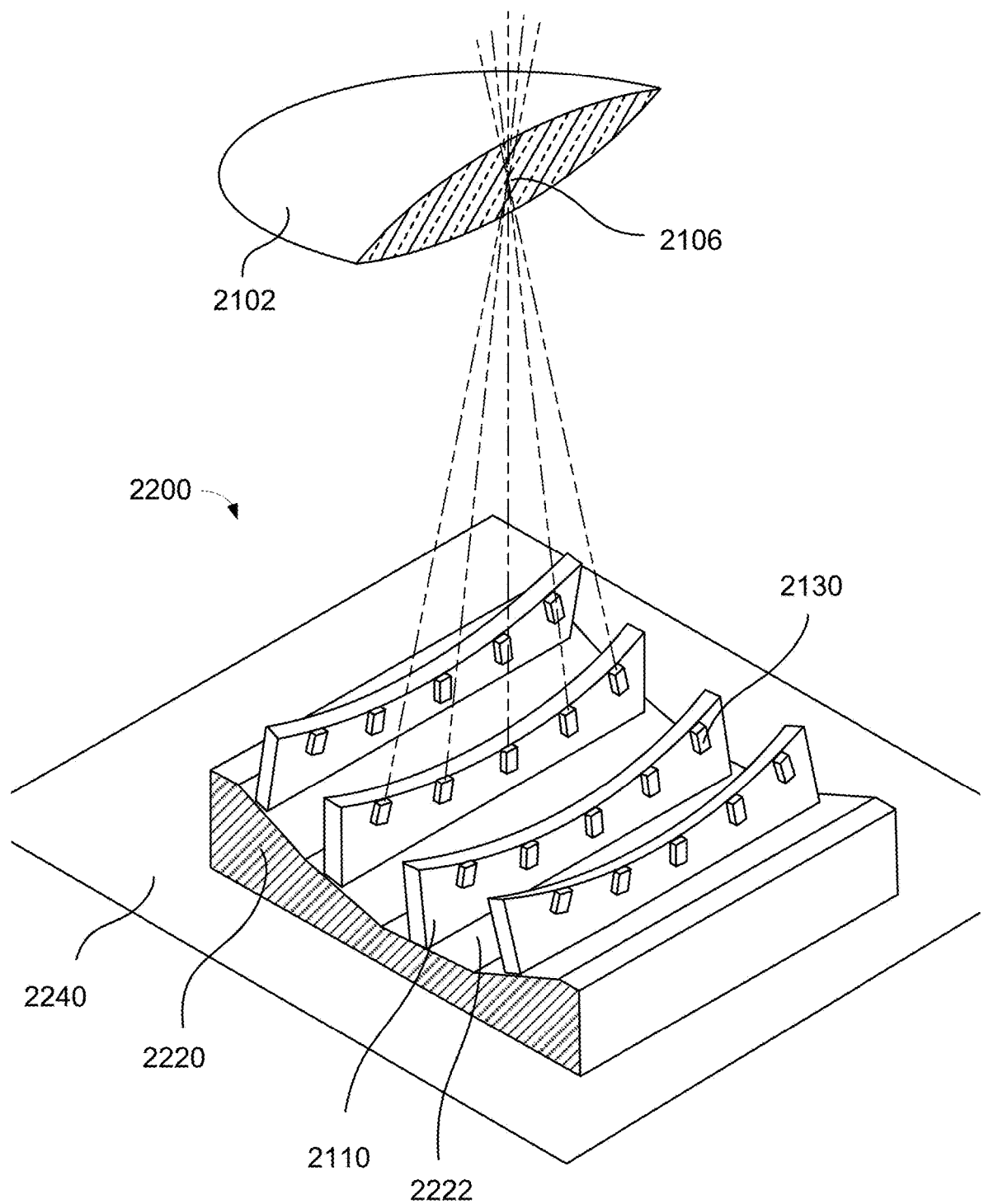

FIGS. 22A and 22B show a cross-sectional view and a perspective view, respectively, of an exemplary two-dimensional optoelectronic array 2200 for a LiDAR system according to some embodiments. Similar to the two-dimensional optoelectronic array 2100 illustrated in FIG. 21, the two-dimensional optoelectronic array 2200 includes a plurality of SMD packages 2110. Each SMD package 2110 includes a one-dimensional array of optoelectronic components 2130 (e.g., light sources or detectors, or combination of light sources and detectors), similar to the optoelectronic package 1510 shown in FIG. 15B. Here, the plurality of SMD packages 2110 are soldered to an interposer 2220. The interposer 2220 has a plurality of facets 2222. Each respective SMD package 2110 is mounted on a respective facet 2222. The plurality of facets 2222 are fabricated with specific heights and angles, so that all optoelectronic components 2130 of the different SMD packages 2110 may have their surfaces lying on the surface of best focus of the optical lens 2102, and/or point substantially toward the lens center 2106. The interposer 2220 may be then soldered to a PCB 2240 (e.g., a planar PCB). The interposer 2220 may include metal pads with electrical interconnections (not shown) to electrically couple the SMD packages 2110 to the PCB 2240. Other methods of electrical connection such as wire-bonding and conductive epoxy may also be employed. Alternatively, the interposer 2220 may be attached first to the PCB 2240, and then the SMD packages 2110 may be attached to the interposer 2220.

Figure 23:
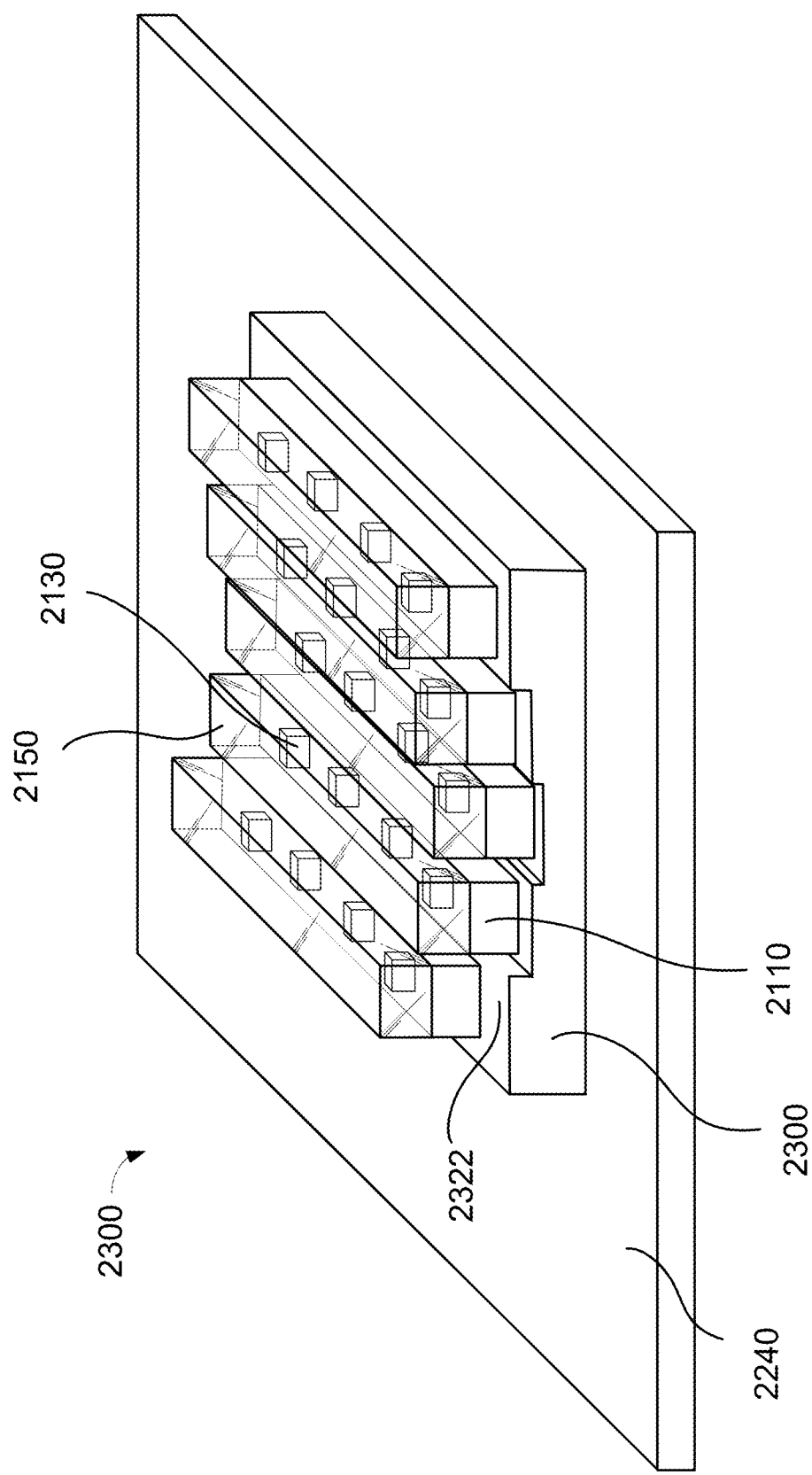
FIG. 23 shows a two-dimensional optoelectronic array according to some embodiments.

FIG. 23 shows a two-dimensional optoelectronic array 2300 according to some embodiments. The two-dimensional optoelectronic array 2300 is similar to the two-dimensional optoelectronic array 2200 illustrated in FIGS. 22A-22B. Here, the interposer 2300 has stepped facets 2322. Each SMD package 2110 includes a clear encapsulant 2150 that covers the optoelectronic components 2130. Each SMD package 2110 may include a substrate that has a slanted surface tilted at the desired angles, so that all optoelectronic components 2130 of the different SMD packages 2110 may point substantially toward the lens center 2106.

Figure 24B:
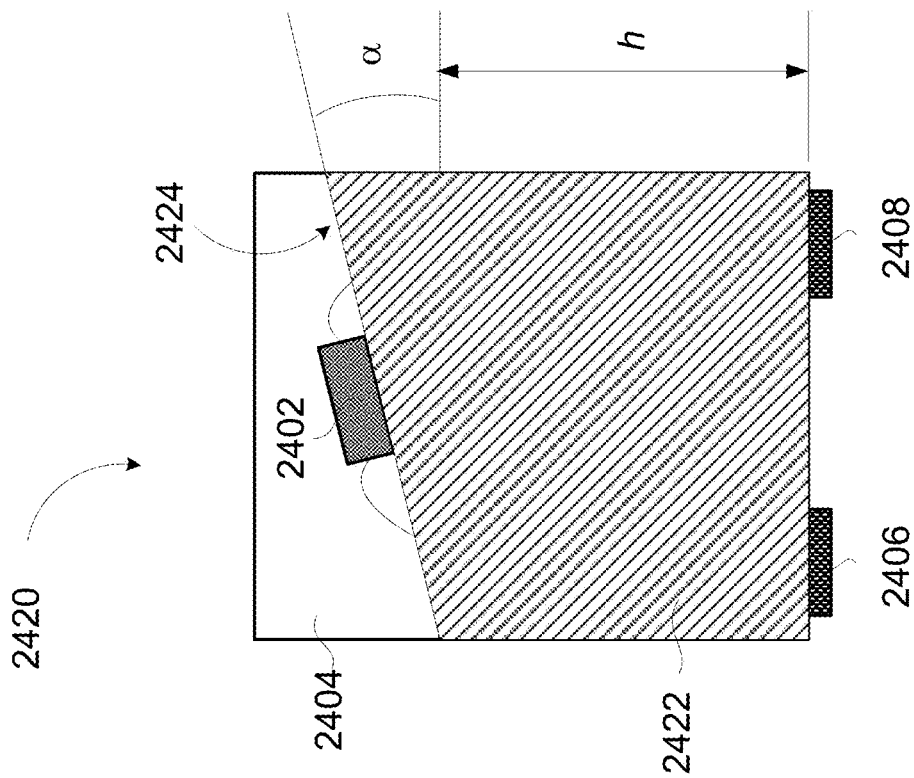
FIGS. 24A and 24B show schematic end views of some exemplary SMD packages that may be utilized in the two-dimensional optoelectronic array according to some embodiments.
Figure 24A:
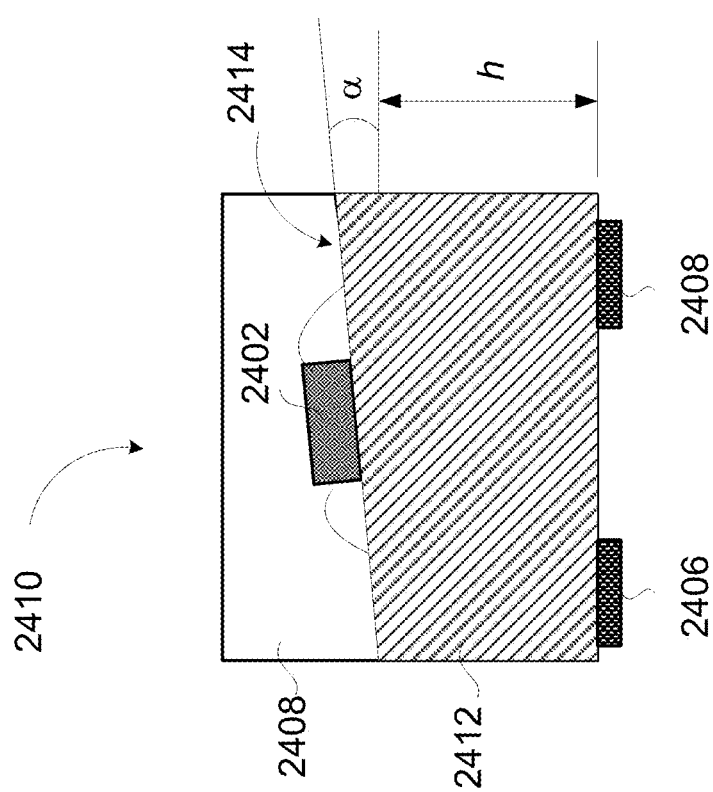

FIGS. 24A and 24B show schematic end views of some exemplary SMD packages 2410 and 2420 that may be utilized in the two-dimensional optoelectronic array 2300 according to some embodiments. Each of the SMD packages 2410 and 2420 may include a one-dimensional array of optoelectronic components 2402 mounted on a substrate 2412 or 2422 (the array of optoelectronic components 2402 is distributed along a direction perpendicular to the page). Each of the substrate 2412 and 2422 has a slanted surface 2414 or 2424. The surface slanting angle α may vary depending on the position of the SMD package 2410 or 2420 with respect to the optical axis. For example, an SMD package 2410 positioned closer to the optical axis may have a relatively smaller slanting angle α as illustrated in FIG. 24A, and a SMD package 2420 positioned farther away from the optical axis may have a relatively larger slanting angle α as illustrated in FIG. 24B. The SMD package 2410 or 2420 may be covered with a transparent cover 2404, and may include solder pads 2406 and 2408 on chip base 2412 or 2422. The height h of the substrate 2412 or 2422 may be the same according to some embodiments. For example, as illustrated in FIG. 23, the heights of the optoelectronic components 2130 in each respective SMD package 2110 may be set correctly by the height of the respective facet 2322. In some embodiments, the height h of the substrate 2412 or 2422 may vary depending on the position of the SMD package 2410 or 2420 with respect to the optical axis. For example, the SMD packages 2410 and 2420 may be directly soldered onto the PCB 2240 shown in FIG. 23 without the interposer 2300. The heights of the optoelectronic components 2130 in each respective SMD package 2110 may be set correctly by the height h of the substrate 2412 or 2422 of the respective SMD package 2410 or 2420.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A LiDAR system comprising:
a first optical lens characterized by a first optical axis, a first lens center, and a first surface of best focus;
a first optoelectronic package spaced apart from the first optical lens along the first optical axis, the first optoelectronic package comprising a first plurality of optoelectronic components positioned on a first substrate;
a printed circuit board (PCB), wherein the first optoelectronic package is mounted on the printed circuit board;
a second optoelectronic package mounted on the PCB, the second optoelectronic package comprising:
a second substrate spaced apart from the first optical lens along the first optical axis; and
a second plurality of optoelectronic components positioned on the second substrate, wherein surfaces of respective optoelectronic components of the second plurality of optoelectronic components lie substantially on the first surface of best focus;
an interposer mounting the first optoelectronic package on the PCB, wherein:
the interposer mounts the first optoelectronic package at a different height from the PCB than a height that the second optoelectronic package is mounted from the PCB, so that surfaces of respective optoelectronic components of the first plurality of optoelectronic components lie substantially on the first surface of best focus; and
the first surface of best focus is curved;
a second optical lens characterized by a second optical axis, a second lens center, and a second surface of best focus; and
a third optoelectronic package spaced apart from the second optical lens along the second optical axis, the third optoelectronic package comprising a third plurality of optoelectronic components positioned on a third substrate, separate from the first substrate, such that a surface of each respective optoelectronic component of the third plurality of optoelectronic components lies substantially on the second surface of best focus, wherein the second surface of best focus is curved.

2. The LiDAR system of claim 1 wherein:
the first plurality of optoelectronic components is positioned on the first optoelectronic package such that each respective optoelectronic component of the first plurality of optoelectronic components is oriented substantially toward the first lens center; and
the second plurality of optoelectronic components is positioned on the second optoelectronic package such that each respective optoelectronic component of the second plurality of optoelectronic components is oriented substantially toward the second lens center.

3. The LiDAR system of claim 1 wherein the first optoelectronic package comprises a first surface mount device (SMD) package, and the second optoelectronic package comprises a second SMD.

4. The LiDAR system of claim 3, wherein the PCB is a first PCB, and the LiDAR system further comprises a second PCB, separate from the first PCB, wherein the second optoelectronic package is mechanically and electrically coupled to the second PCB.

5. The LiDAR system of claim 4 wherein the first PCB has a first curved surface on which the first optoelectronic package is mounted, and the second PCB has a second curved surface on which the second optoelectronic package is mounted.

6. The LiDAR system of claim 3, wherein the-second optoelectronic package is mechanically and electrically coupled to the PCB.

7. The LiDAR system of claim 3 wherein the first optoelectronic package is one of a plurality of first optoelectronic packages, the-second optoelectronic package is one of a plurality of second optoelectronic packages, the interposer is a first interposer, and the LiDAR system further comprises:
the first interposer having a first plurality of facets, wherein the plurality of first optoelectronic packages are mounted on the first interposer, each respective first optoelectronic package being disposed on a respective facet of the first plurality of facets; and
a second interposer having a second plurality of facets, wherein the plurality of second optoelectronic packages are mounted on the second interposer, each respective second optoelectronic package being disposed on a respective facet of the second plurality of facets.

8. The LiDAR system of claim 1 wherein:
the first plurality of optoelectronic components includes a plurality of light sources; and
the second plurality of optoelectronic components includes a plurality of detectors.

9. The LiDAR system of claim 1 wherein:
the first plurality of optoelectronic components includes a first set of light sources and a first set of detectors; and
the second plurality of optoelectronic components includes a second set of light sources and a second set of detectors.

10. A LiDAR system comprising:
an optical lens characterized by an optical axis, a lens center, and a surface of best focus;
a printed circuit board (PCB); and
a first optoelectronic package mounted on the PCB, the first optoelectronic package comprising:
a first substrate spaced apart from the optical lens along the optical axis; and
a first plurality of optoelectronic components positioned on the first substrate;
a second optoelectronic package mounted on the PCB, the second optoelectronic package comprising:
a second substrate spaced apart from the optical lens along the optical axis; and
a second plurality of optoelectronic components positioned on the second substrate, wherein a surface of each respective optoelectronic component of the second plurality of optoelectronic components lies substantially on the surface of best focus of the optical lens; and
an interposer mounting the first optoelectronic package on the PCB, wherein:
the interposer mounts the first optoelectronic package at a different height from the PCB than a height that the second optoelectronic package is mounted from the PCB, so that surfaces of respective optoelectronic components of the first plurality of optoelectronic components lie substantially on the surface of best focus; and
the surface of best focus is curved.

11. The LiDAR system of claim 10 wherein each respective optoelectronic component of the first plurality of optoelectronic components is positioned on the first substrate such that the respective optoelectronic component of the first plurality of optoelectronic components is oriented substantially toward the lens center.

12. The LiDAR system of claim 10 being configured as a surface mount device (SMD) package for mechanically and electrically coupling to the PCB.

13. The LiDAR system of claim 10 wherein the first plurality of optoelectronic components includes a plurality of light sources or a plurality of detectors.

14. The LiDAR system of claim 10 wherein the first plurality of optoelectronic components includes a set of light sources and a set of detectors.

15. The LiDAR system of claim 10 wherein the first substrate has a surface characterized by a plurality of facets, each respective optoelectronic component of the first plurality of optoelectronic components being positioned on a respective facet of the plurality of facets.

16. A system, the system comprising:
an optical lens characterized by an optical axis, a lens center, and a surface of best focus;
a printed circuit board (PCB);
a first optoelectronic package mounted on the PCB, the first optoelectronic package comprising:
a first substrate spaced apart from the optical lens along the optical axis; and
a first plurality of optoelectronic components positioned on the first substrates;
a second optoelectronic package mounted on the PCB, the second optoelectronic package comprising:
a second substrate spaced apart from the optical lens along the optical axis; and
a second plurality of optoelectronic components positioned on the second substrate, wherein a surface of each respective optoelectronic component of the second plurality of optoelectronic components lies substantially on the surface of best focus of the optical lens; and
an interposer mounting the first optoelectronic package on the PCB, wherein:
the interposer mounts the first optoelectronic package at a different height from the PCB than a height that the second optoelectronic package is mounted from the PCB, so that surfaces of respective optoelectronic components of the first plurality of optoelectronic components lie substantially on the surface of best focus; and the surface of best focus is curved.

17. The system of claim 16 wherein the first optoelectronic package is configured as a surface mount device (SMD) package for mechanically and electrically coupling to the PCB.

18. The system of claim 16 wherein the first plurality of optoelectronic components includes a plurality of light sources or a plurality of detectors.

19. The system of claim 16 wherein the first plurality of optoelectronic components includes a set of light sources and a set of detectors.

20. The system of claim 19 wherein the first substrate has a top surface and a side surface, and wherein the set of light sources is disposed on the side surface, and the set of detectors is disposed on the top surface.

21. The system of claim 19 further comprising the interposer mounting the second optoelectronic package on the PCB.

22. The LiDAR system of claim 10 further comprising the interposer mounting the second optoelectronic package on the PCB.

23. The LiDAR system of claim 10, wherein the first optoelectronics package is soldered to the interposer.

24. The LiDAR system of claim 10, wherein the interposer comprises metal pads for electrical connections.

25. The LiDAR system of claim 10, wherein the interposer provides multiple electrical connections from the first optoelectronics package to the PCB.

* * * * *